(12) United States Patent
McGill, Sr. et al.

(10) Patent No.: US 7,872,843 B2
(45) Date of Patent: Jan. 18, 2011

(54) TELECOM POWER DISTRIBUTION UNIT WITH INTEGRATED FILTERING AND TELECOM SHELF COOLING MECHANISMS

(75) Inventors: Terrence Michael McGill, Sr., Stevensville, MD (US); David Bennitt Harris, Columbia, MD (US); Michael Stephen Brown, Pasadena, MD (US); Richard Hobbs, Walkersville, MD (US); Curtis Keys, Mt Airy, MD (US)

(73) Assignee: Ciena Corporation, Linthicum, MD (US)

( * ) Notice: Subject to any disclaimer, the term of this patent is extended or adjusted under 35 U.S.C. 154(b) by 376 days.

(21) Appl. No.: 12/062,053

(22) Filed: Apr. 3, 2008

(65) Prior Publication Data

US 2009/0251851 A1 Oct. 8, 2009

(51) Int. Cl.
*H02H 5/00* (2006.01)
(52) U.S. Cl. .................................... 361/104
(58) Field of Classification Search ............... 361/104
See application file for complete search history.

(56) References Cited

U.S. PATENT DOCUMENTS 5,223,806 A * 6/1993 Curtis et al. .................. 333/12
5,293,145 A * 3/1994 Rynkiewicz .................. 336/65
6,937,454 B2 * 8/2005 Mikolajczak et al. ........ 361/111
7,495,525 B2 * 2/2009 Ilkov et al. ..................... 333/26

* cited by examiner

*Primary Examiner*—Stephen W Jackson
(74) *Attorney, Agent, or Firm*—Clements Bernard PLLC; Christopher L. Bernard; Tyler S. Brown

(57) ABSTRACT

The present invention provides highly efficient system level EMI filtering in a dual feed Power Distribution Unit (PDU) using custom designed magnetic components that are uniquely designed to provide excellent performance under various load conditions. The PDU of the present invention includes filters for providing the necessary EMI filtering at all frequencies in the range between 200 Hz and 200 MHz under all load conditions including a single feed failure. Additionally, the present invention provides mechanisms for cooling EMI components using a combination of natural convection and conduction techniques at the board level to ensure no loss of EMI filtering performance. The present invention also includes blank panels made of formed Aluminum alloy sheet metal pieces or the like to direct air flow to components on printed wiring boards (PWB's) using air director plates.

18 Claims, 20 Drawing Sheets

TELECOM POWER DISTRIBUTION UNIT WITH INTEGRATED FILTERING AND TELECOM SHELF COOLING MECHANISMS

FIELD OF THE INVENTION

The present invention relates generally to telecommunication equipment. More specifically, the present invention provides a telecom power distribution unit with integrated filtering for telecom and datacom rack and shelves along with cooling mechanisms for the power distribution unit and other modules in the rack and shelves.

BACKGROUND OF THE INVENTION

Conventionally, communication system designs typically use point of load power line filtering due to numerous reliability issues associated with filtering at a Power Distribution Unit (PDU). Alternatively, conventional system designs can use redundant PDU filtering, however this takes up significant space on a module and/or at a rack level which in turn limits space, bandwidth, etc. and increases cost. Conventional systems that use feed power filtering at the rack distribution point must be design and installed as redundant which disadvantageously takes up considerable rack space.

A PDU is a device configured to distribute electrical power. Communication systems are typically deployed in frames or racks with one or more PDUs. The PDUs are connected to an external power supply unit. For example, PDUs can include two 70 Amp modules with dual feeds on each module, two 500 Amp modules with eight feeds to each, an 80 Amp PDU with dual feed, and the like. Currently communications equipment receive power from a Central Office (CO) that is delivered to a fuse (or circuit breaker) panels that is connected to shelves of equipment located in the same rack.

Traditionally, the electromagnetic interference (EMI) generated by other racks of equipment at the CO or other shelves in the same rack requires numerous broadband filters located on each module and fan assembly in the shelf. These filters must be effective at frequencies below 200 Hz to over 200 MHz for reliable operation as well as regulatory compliance. At the lower frequencies, components are large and take up valuable board space as well as generate heat which needs to be removed. At higher frequencies, capacitors need to be connected to a low impedance ground path while meeting 1000V standoff requirements.

Typically, communication systems are deployed through shelves housed on a rack. The rack also includes the PDU which is configured to provide power to the shelves. The shelves are configured to house modules for data processing, input/output interfaces, control, and the like. In the case of a next-generation dense wave division multiplexed (DWDM) system, for example, with three shelves in a rack containing more than sixty data processing modules and up to forty high flow fans modules per rack requires over a hundred filter circuits on the associated modules. The advantage of the traditional method of putting the filter networks on the modules is that the modules are cooled using redundant fans to meet reliability requirements. There are numerous disadvantages in placing that many filter circuits on modules including taking up considerable space limiting the number of data channels in a rack.

Additionally, the shelves utilize individual blank modules with faceplates for unequipped modules. These faceplates can include many features of installed (i.e., equipped) modules including EMI gaskets on two edges and ejector shields. The blanks have a vertical member to direct air-flow and simulate the module printed circuit board (PCB). Where multiple slots depending on system configuration need covering, a larger blank with single vertical section have been used as well as multiple single slot blanks.

The use of individual blanks with a single vertical member and gaskets on vertical edges has limitations such as requiring multiple blanks where several slots need covering and the air-flow in the blank area is greater than across adjacent module heat sinks and components because the pressure is much lower where the blanks are installed. The present single slot blank also has cost and environmental performance issues. The use of multiple slot blanks with a single vertical member and gaskets on vertical edges has even greater air-flow in the blank area than across adjacent modules with heat sinks and components because the pressure is much lower where the blank are installed. The single slot blank all has EMC issues due to structural weakness and environmental performance issues due to the lower pressure. The result is significant flow bypass in the air around the blank which starves the active modules that require more airflow.

BRIEF SUMMARY OF THE INVENTION

In various exemplary embodiments, the present invention provides highly efficient system level EMI filtering in a multiple feed Power Distribution Unit (PDU) using custom designed magnetic components that are uniquely designed to provide excellent performance under various load conditions. The PDU of the present invention includes filters for providing the necessary EMI filtering at all frequencies in the range between 200 Hz and 200 MHz under all load conditions including feed failures. Additionally, the present invention provides mechanisms for cooling EMI components using a combination of natural convection and conduction techniques at the board level to ensure no loss of EMI filtering performance. The present invention also includes blank panels made of formed Aluminum alloy sheet metal pieces or the like to direct air flow to components on printed wiring boards (PWB's) using air director plates. The air director plates are connected to a vertical support at angles determined to provide the optimal air-flow over components on the PWB.

In an exemplary embodiment of the present invention, a power distribution unit (PDU) includes a printed circuit board; input power connections including a redundant feed from a power source; a common mode transformer vertically mounted on the printed circuit board, wherein the common mode transformer is configured to provide filtered power in multiple power feeds while limiting common mode emission levels; one or more inductors mounted on the printed circuit board, wherein the one or more inductors are configured to provide filtered power from the input power connections while limiting differential mode emission levels; and a plurality of fuses configured to received the filtered power from the common mode transformer and the one or more inductors. The one or more inductors can include high flux cores with at least 50% nickel content. Optionally, the one or more inductors are configured to provide filtered power of up to 80 A while limiting differential mode emission levels. Alternatively, the one or more inductors are configured to provide filtered power in two feeds of up to 40 A each while limiting differential mode emission levels. The common mode transformer can include a very high permeability core of MN-ZN with an initial value of $\mu$ of 10000. The printed circuit board can include a six layer stack-up design. Optionally, the PDU further includes a chassis configured to house the printed circuit board, the common mode transformer, and the one or more inductors and the chassis includes perforations for convection. The PDU utilizes convection and conduction cooling to negate a need for fans. The PDU can be configured to provide electromagnetic interference filtering at all frequencies in a range between 200 Hz and 200 MHz under all load conditions including feed failures. Optionally, the PDU is compliant to one or more of NEBS GR63, GR78, GR 1089, IEC 60950, ETSI 300-132-2 and IEC 300-386.

In another exemplary embodiment of the present invention, a telecom power distribution unit (PDU) includes a printed circuit board; input power connections including a redundant feed from a power source; a common mode transformer vertically mounted on the printed circuit board for providing filtered power from the input power connections, wherein the common mode transformer includes a very high permeability core of MN-ZN with an initial value of µL of 10000; one or more inductors mounted on the printed circuit board for providing filtered power from the input power connections, wherein the one or more inductors include high flux cores with at least 50% nickel content; and a plurality of fuses configured to received the filtered power from the common mode transformer and the one or more inductors. The one or more inductors can be configured to provide filtered power of up to 80 A while limiting differential mode emission levels. Alternatively, the one or more inductors are configured to provide filtered power in two feeds of up to 40 A each while limiting differential mode emission levels. The common mode transformer can be configured to provide filtered power in two feeds of up to 80 A while limiting common mode emission levels. Optionally, the printed circuit board includes a six layer stack-up design. The telecom PDU can further include a chassis configured to house the printed circuit board, the common mode transformer, and the one or more inductors and the chassis includes perforations for convection. The telecom PDU utilizes convection and conduction cooling to negate a need for fans. Optionally, the telecom PDU is configured to provide electromagnetic interference filtering at all frequencies in a range between 200 Hz and 200 MHz under all load conditions including feed failures, and telecom PDU is compliant to one or more of NEBS GR63, GR78, GR 1089, IEC 60950, ETSI 300-132-2 and IEC 300-386.

In yet another exemplary embodiment of the present invention, a blank plate assembly providing component cooling and EMI shielding in a telecom shelf includes a faceplate including latches configured to secure the faceplate in a shelf; a plate connected to the faceplate through a vertical support, wherein the plate is at a predetermined angle to provide optimal air-flow cover components in the shelf; wherein the plate includes a conductive aluminum finish that provides structural integrity and electromagnetic interference shielding; wherein the faceplate is bonded to the shelf and adjacent panels on the shelf though environmental proven compliant EMI gaskets that have a environmentally proven effective conductive finish. Optionally, the faceplate is sized to fit in one of one slot and four slots on the shelf; and the conductive aluminum finish is compliant to Restriction of Hazardous Substances Directive specifications.

BRIEF DESCRIPTION OF THE DRAWINGS

The present invention is illustrated and described herein with reference to the various drawings, in which like reference numbers denote like system components, respectively, and in which.

DETAILED DESCRIPTION OF THE INVENTION

In various exemplary embodiments, the present invention provides highly efficient system level EMI filtering in a dual feed Power Distribution Unit (PDU) using custom designed magnetic components that are uniquely designed to provide excellent performance under various load conditions. The PDU of the present invention includes filters for providing the necessary EMI filtering at all frequencies in the range between 200 Hz and 200 MHz under all load conditions including a single feed failure. Advantageously, filtering at the PDU system level provides improved packaging density at the circuit pack level as well as improving system reliability.

Additionally, the present invention provides mechanisms for cooling the EMI components using a combination of natural convection and conduction techniques at the board level to ensure no loss of EMI filtering performance. The present invention also uses blank panels made of formed Aluminum alloy sheet metal pieces or the like to direct air flow to components on printed wiring boards (PWB's) using air director plates. The air director plates are connected to a vertical support at angles determined to provide the optimal air-flow over components on the PWB.

Figure 1:
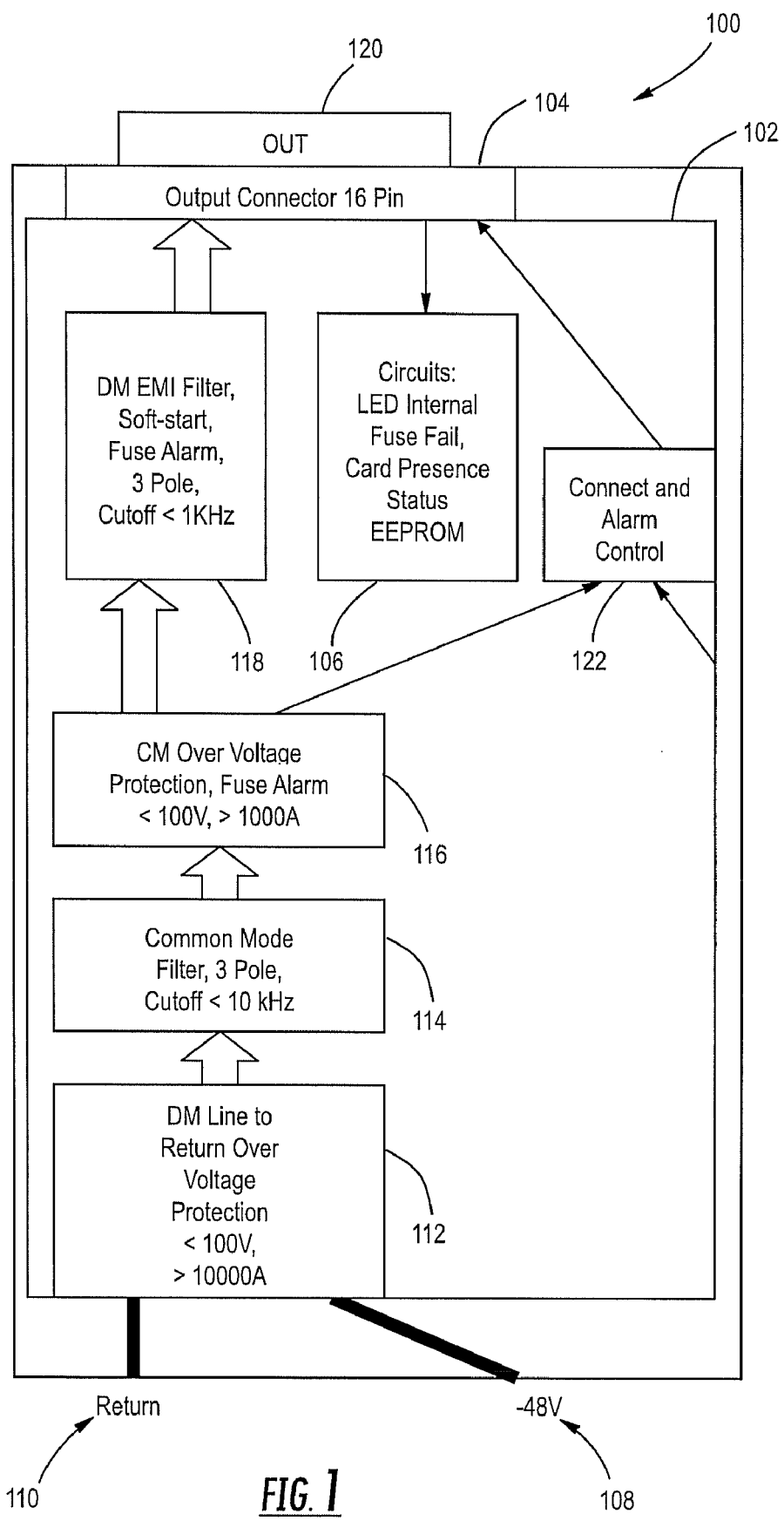
FIG. 1 is a functional block diagram of a Power Distribution Unit (PDU) module with EMI filtering according to an exemplary embodiment of the present invention.

Referring to FIG. 1, a functional block diagram illustrates a Power Distribution Unit (PDU) module 100 with EMI filtering according to an exemplary embodiment of the present invention. The PDU module 100 is configured to provide −48 VDC CO power to rack-mounted equipment and to provide summary alarms. The PDU module 100 include system level over voltage transient protection from the CO environment, system level surge current protection from the CO environment, system level common mode filtering to control emissions and insure conducted immunity from the CO environment, system level differential mode filtering to control emissions and insure conducted immunity between rack shelves as well as with other equipment in the CO environment, and a soft-start feature to limit the current surge otherwise cause by the PDU differential mode filter capacitor charging circuits.

The PDU module 100 includes two to sixteen independent filter power circuit modules 102 (FIG. 1 illustrates one module 100) that feed interface connectors 104 and status indicator LED information 106. The interface connectors 104 are configured to mate with connectors on a chassis to conduct power to a backplane. The PDU module 100 is designed to be air cooled through natural convection. Accordingly, a case for the PDU module 100 includes perforations designed for natural air flow to exhaust out the top.

The PDU module 100 is connected to a −48 VDC power input 108 and a power return 110. These connect to a CO power source (not shown). For example, the power input 108 and power return 110 can include an 80 A feed using 6 American Wire Gauge (AWG) wire. The power inputs 108 can connect to a breaker (not shown), e.g. a 70 A breaker or the like. The power return 110 and the power input 108 after the breaker is connected to an over voltage protection component 112 (DM Line-to-Return Over Voltage Protection <100V, >1000 A).

The over voltage protection component 112 connects to a common mode filter 114 with three pole and a cutoff <10 kHz. The common mode filter 112 connects to an over voltage protection component 114 (CM over voltage protection, fuse alarm, <100V, >1000 A). The over voltage protection component 1 14 connects to a DM EMI filter 1 18 with LF three pole and a cutoff <1 KHz. This connects to the output connector 104 which is configured to provide power to a backplane or the like through an output 120. The power circuit module 102 also includes a connect and alarm control component 122 configured to provide status and alarming of the module 102.

In exemplary embodiments of the present invention, A PDU can use a combination two channel rectangular and/or a single channel L-shaped filter assembly. These filter assemblies are designed to provide the necessary EMI filtering at all frequencies in the range below 1 kHz to above 200 MHz under all load conditions including a single feed failure. Filtering at a system level is a key feature that provides improved packaging density at the circuit pack level, i.e. by removing distributed filter components from each circuit pack, as well as improving system reliability.

The present invention uses a combination of natural convection and conduction techniques at the board level ensuring no loss of EMI filtering performance or system reliability which is integral to the EMI filter design. The combined natural convection and conduction cooling techniques include features that are compliant with various safety and Electromagnetic Compatibility (EMC) agency requirements. The present invention uses a combination of features for cooling including Printed Circuit Board (PCB) copper pours that are located on six layers of the circuit boards, custom magnetic parts, and high density connectors that sink heat in the PCB for optimal cooling while meeting the safety compliance opening requirements. These features are contained in both the two channel rectangular and/or a single channel L-shaped filter assemblies described herein.

In addition to saving board space, a requirement to cool lower frequency filter components is removed from the module allowing for more powerful signal processing components. By placing the filters in the power unit, the present invention realizes a significant space saving maximizing valuable rack space usage. This enhanced EMI filtering approach can contribute to a planned rack level data processing rate increase by up to a factor of eight. The use of convection cooling of the PDU is needed because the use of replaceable redundant fans in the PDU is too costly in terms of space taken up and system reliability. The present invention is based on convection and conduction cooling using PCB design in combination with custom parts and components that negate the need to use fans for filter element cooling altogether and eliminating the costs associated with spare fans or additional racks to install more data channel modules that process signals up to 40 G if the filtering is done remotely.

Figure 2:
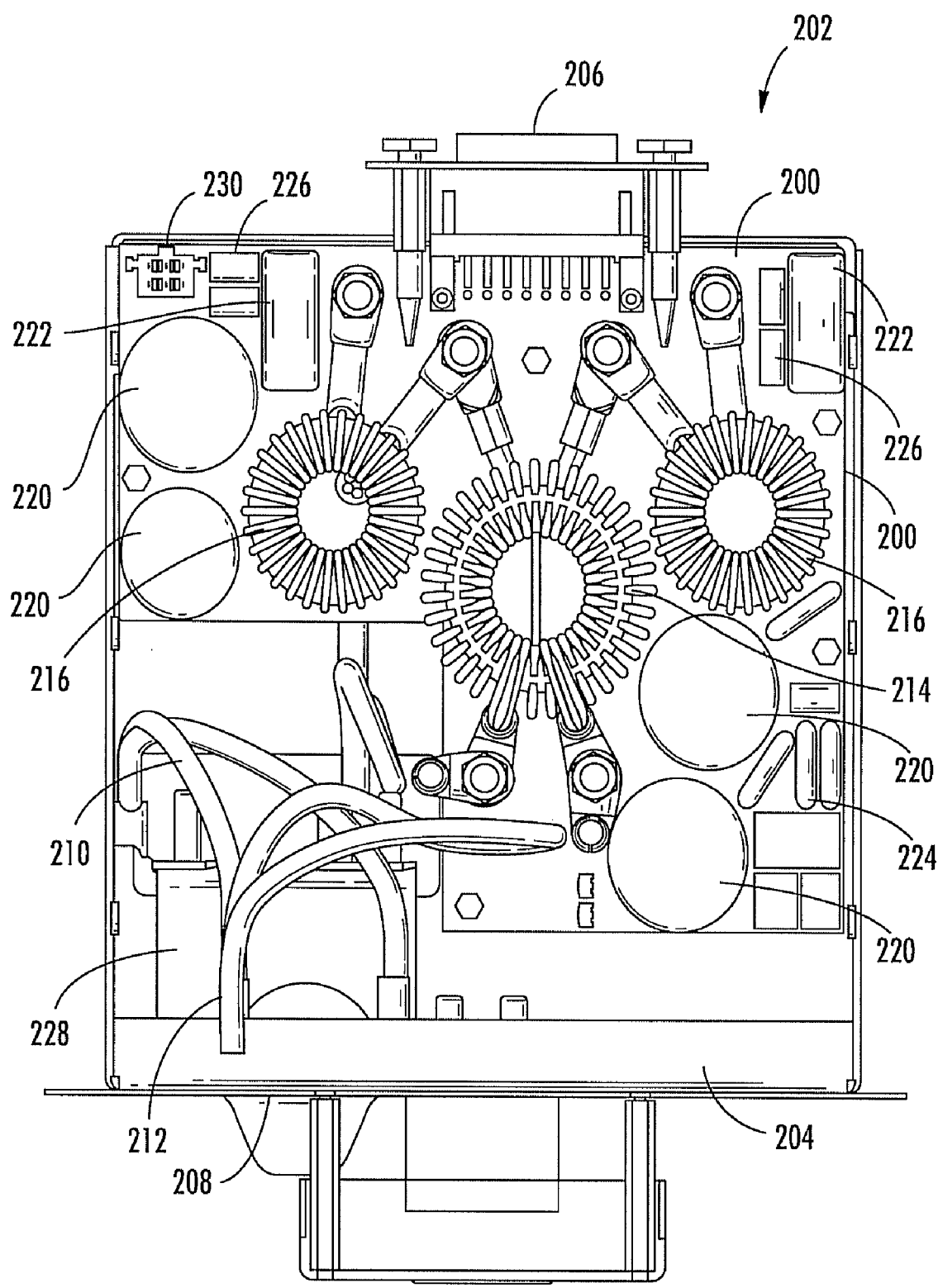
FIG. 2 is a diagram of a small-sized PDU module including a single L-shaped filter module in a chassis according to an exemplary embodiment of the present invention.
Figure 3:
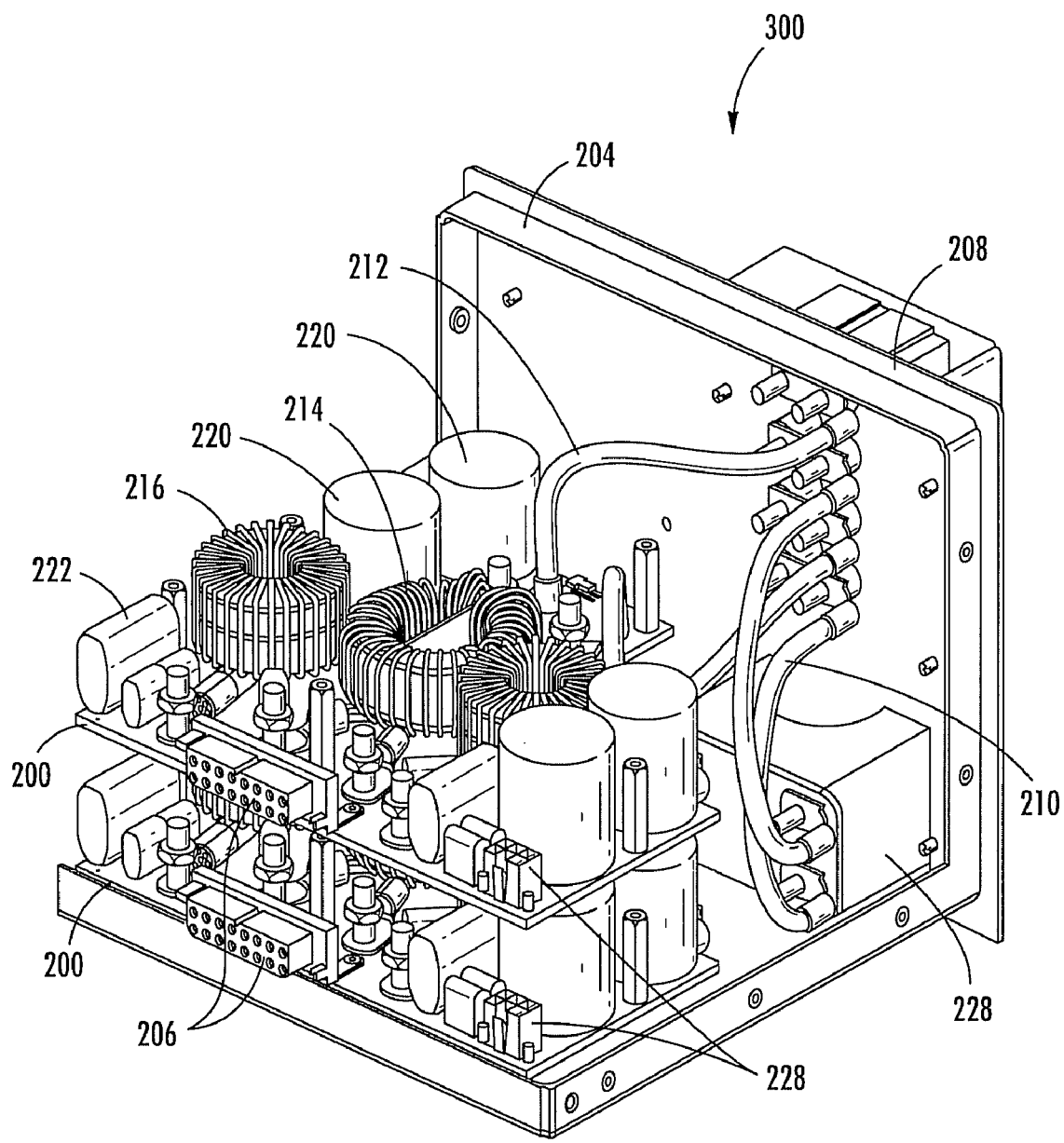
FIG. 3 is a diagram of a medium-sized PDU module including two L-shaped filter modules in a chassis according to an exemplary embodiment of the present invention.

Referring to FIGS. 2-3, an L-shaped filter module 200 is illustrated in a small and medium sized PDU application according to an exemplary embodiment of the present invention. FIG. 2 illustrates a single filter module 200 in a small configuration, and FIG. 3 illustrates two filter modules 200 in a medium configuration. The L-shaped filter module 200 can support 80 A with a circuit breaker of fuse in values up to 100 A.

In FIG. 2, a small-sized PDU module 202 includes a single L-shaped filter module 200 in a chassis 204. The chassis 204 is configured to plug into a rack-mounted shelf or the like, and a connector 206 located on the module 200 is configured to mate to a corresponding connector (not shown) on the rack-mounted shelf or the like. The chassis 204 includes a front faceplate 208 which includes connections for a dual-feed −48 VDC power cable 210 and a dual-feed return power cable 212. The power cables 210, 212 are connected to a power supply in the CO, and each cable 210, 212 is terminated on the module 200. The cable 210 connection is through the fuse or breaker assembly.

In FIG. 3, a medium-sized PDU module 300 includes two L-shaped filter modules 200 in a chassis 204. The chassis 204 is configured to plug into a rack-mounted shelf or the like, and two connectors 206 located on the modules 200 are configured to mate to a corresponding connector (not shown) on the rack-mounted shelf or the like. The chassis 204 includes a front faceplate 208 which includes connections for a dual-feed −48 VDC power cable 210 and a dual-feed return power cable 212. The power cables 210, 212 are connected to a power supply in the CO, and each cable 210, 212 is terminated on the modules 200. The filter modules have also been designed in rectangular shape in both vertical and horizontal orientation.

The L-shaped filter module 200 is designed for optimization of a maximum current flow for each of the −48V and return power traces including the transformer and inductors, while maintaining a 1000 VDC voltage isolation between these power traces and ground nets as specified in safety requirements, such as IEC 60950 and Bellcore GR78. Based on these requirements, the filter module 200 utilizes a six layer stack-up design.

The power cables 210, 212 terminate on the L-shaped filter module 200 which routes power from the cables 210, 212 to a common mode transformer 214, a pair of inductors 216, a plurality of capacitors 220, 222, 226. The transient suppression devices 224 are connected between the power traces and ground nets the input connectors. The common module transformer 214 connects to both of the inductors 216, and the transformer 214 and inductors 216 are configured to feed 80 A to fans and shelves in a rack while limiting emission levels. The −48 VDC power cable 210 terminates on a breaker 228 which connects to the common mode transformer 214. The breaker 228 is configured to provide circuit protection to the module 200. The L-shaped filter module 200 also includes a jumper connection 230 to connect multiple modules 200, such as in the medium-sized application.

Figure 9:
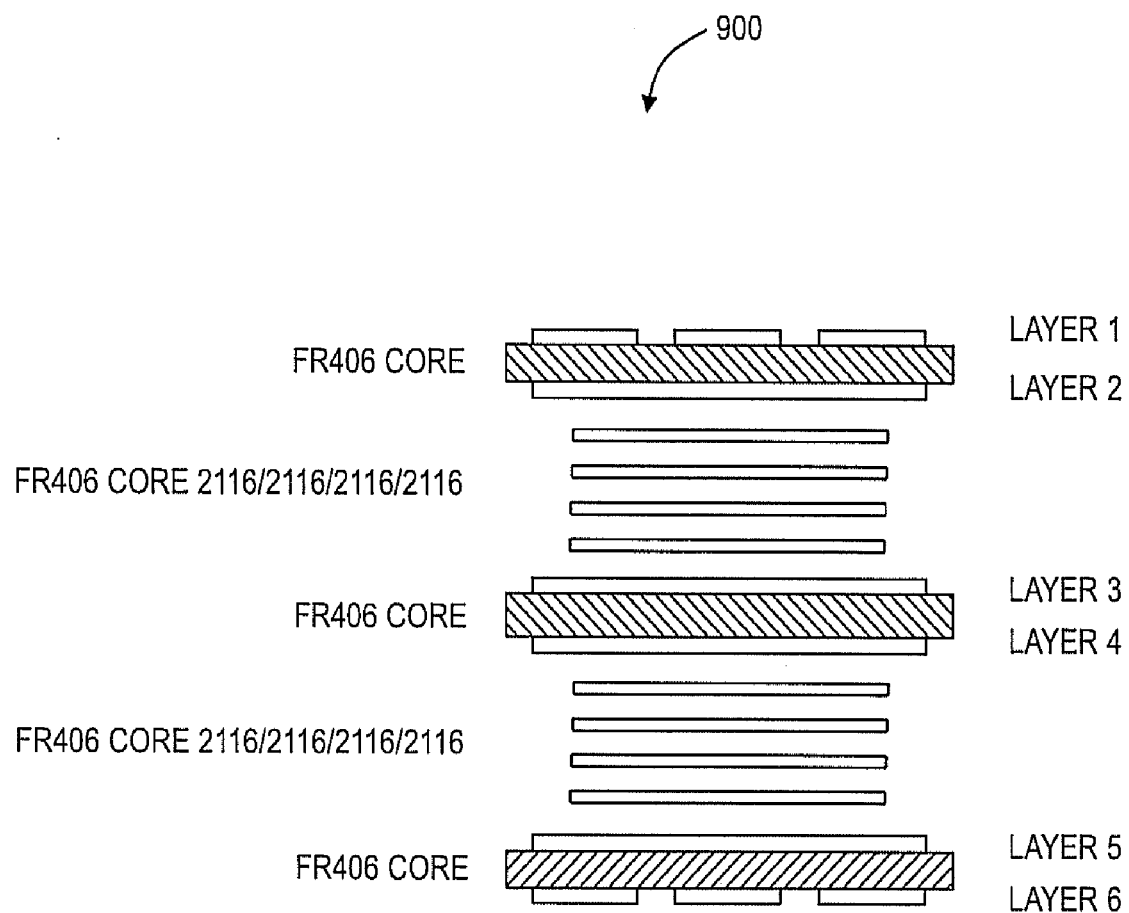
FIG. 9 is a cross-sectional diagram of a printed circuit board (PCB) illustrating a six layer construction design for filter modules for the various boards described herein according to an exemplary embodiment of the present invention.

The over voltage protection component 112 is provided by suppression devices 224. The over voltage protection component 114 include the transformer 214, and film capacitors 226. The CM overvoltage protection box 116 is provided by the transient suppression devices 224. The DM EMI filter 118 components include the inductors 216, electrolytic capacitors 220, and film capacitors 222 as well as SMT parts on the underside of the PCB 200. The status indicator LED information 106 includes circuits as SMT parts on the underside of the PCB 200. The connect and alarm control component 122 include connector 230 with most parts on the underside of the PCB 200. The connections between the components are through PCB traces on the six layers of PCB 200 (e.g., the six layers are illustrated in FIG. 9). These traces have been designed for providing optimal thermal and EMI filter performance.

Figure 4:
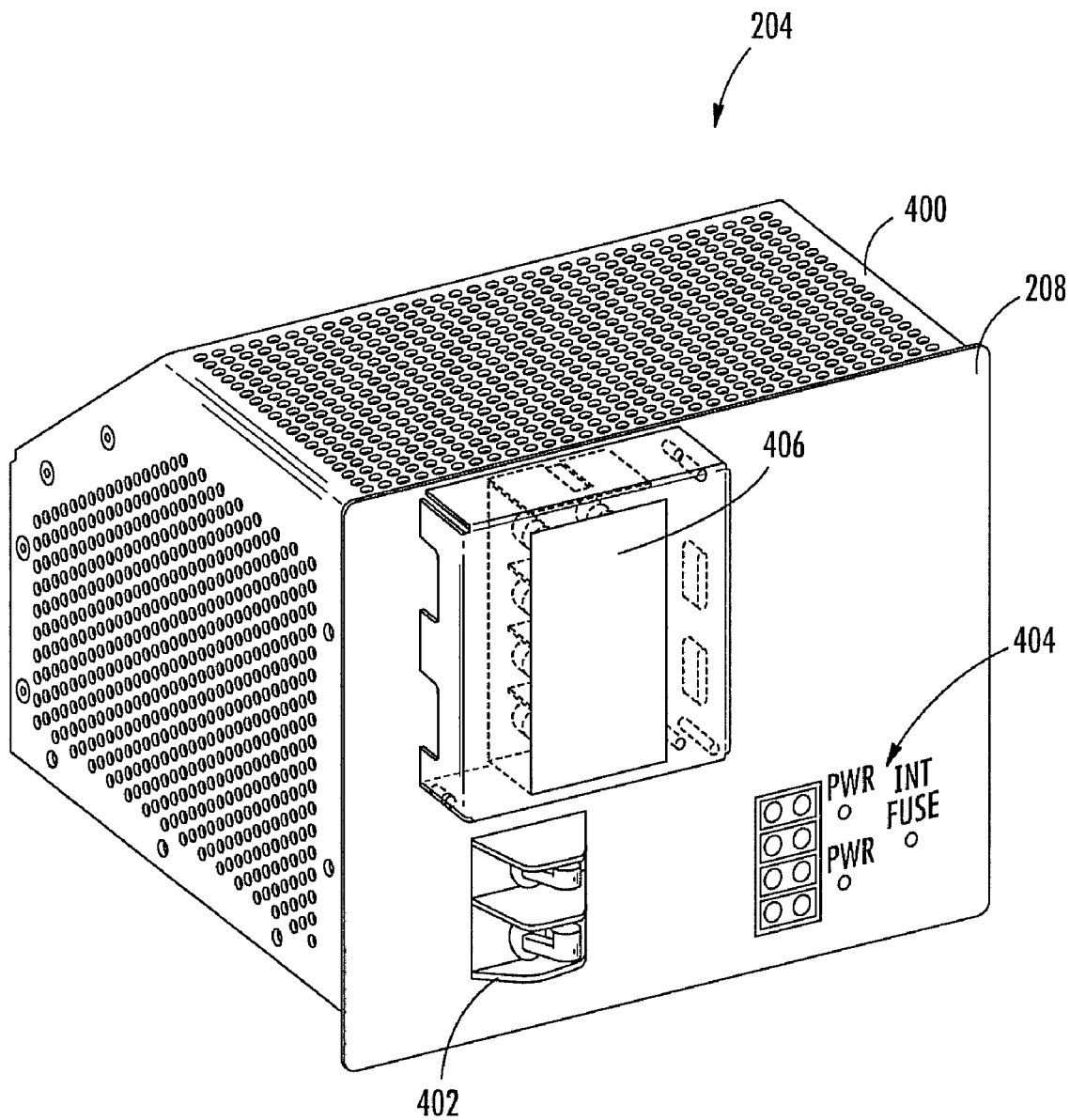
FIG. 4 is a diagram of the chassis in FIGS. 2 and 3 with a cover over the filter modules according to an exemplary embodiment of the present invention.

Referring to FIG. 4, a view is illustrated of the chassis 204 with a cover 400 over the filter modules 200 according to an exemplary embodiment of the present invention. As described herein, the chassis 204 is configured to plug into a shelf. The cover 400 includes perforations which provide air flow to be concentrated around major heat sources on the filter modules 200. The front faceplate 208 includes an on/off switch 402, light-emitting diode (LED) indicators 404, and power connections 406. The LED indicators 404 can provide status for a pair of filter modules 200 and for an internal fuse, such as on the breaker 228. The power connections 406 can include a cover along with openings for power cables from a power source for dual-feed −48 VDC and dual-feed return cables.

Figure 5:
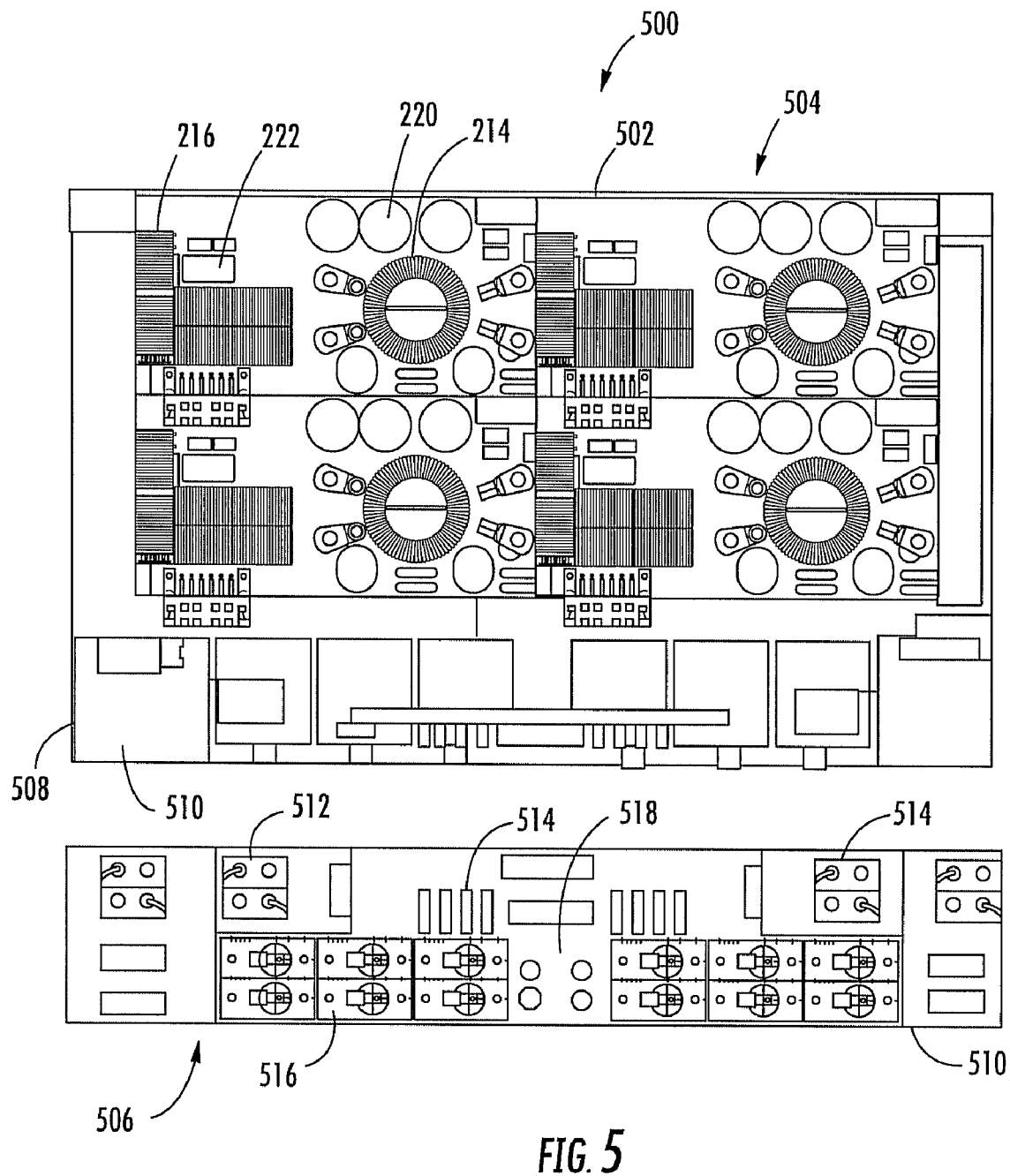
FIG. 5 is a large-sized PDU module with a combination of four rectangular two channel modules according to an exemplary embodiment of the present invention.

Referring to FIG. 5, a large-sized PDU module 500 is illustrated as a combination of four rectangular two channel modules 502 according to an exemplary embodiment of the present invention. FIG. 5 illustrates a top view 504 and a front view 506 of a chassis 508 configured to house the four rectangular two channel modules 502. The chassis 508 is configured to mount into a rack, and to distribute power to one or more shelves in the rack.

The chassis 508 includes a front faceplate 510 with connections 512, 514 for a dual-feed power cable (i.e., −48 VDC and return for an A feed connection 512 and a B feed connection 514). The faceplate 510 also includes a plurality of breakers 516, LED status indicators 518, and multiple fuses 520. The connections 512, 514 are configured to route power from the dual-feed power cable to each of the modules 502 in the chassis 508. The breakers 516 are configured to provide circuit protection. Each module 502 includes multiple inductors 216, a common mode transformer 214 as well as multiple capacitors 220, 222, 226.

Figure 6:
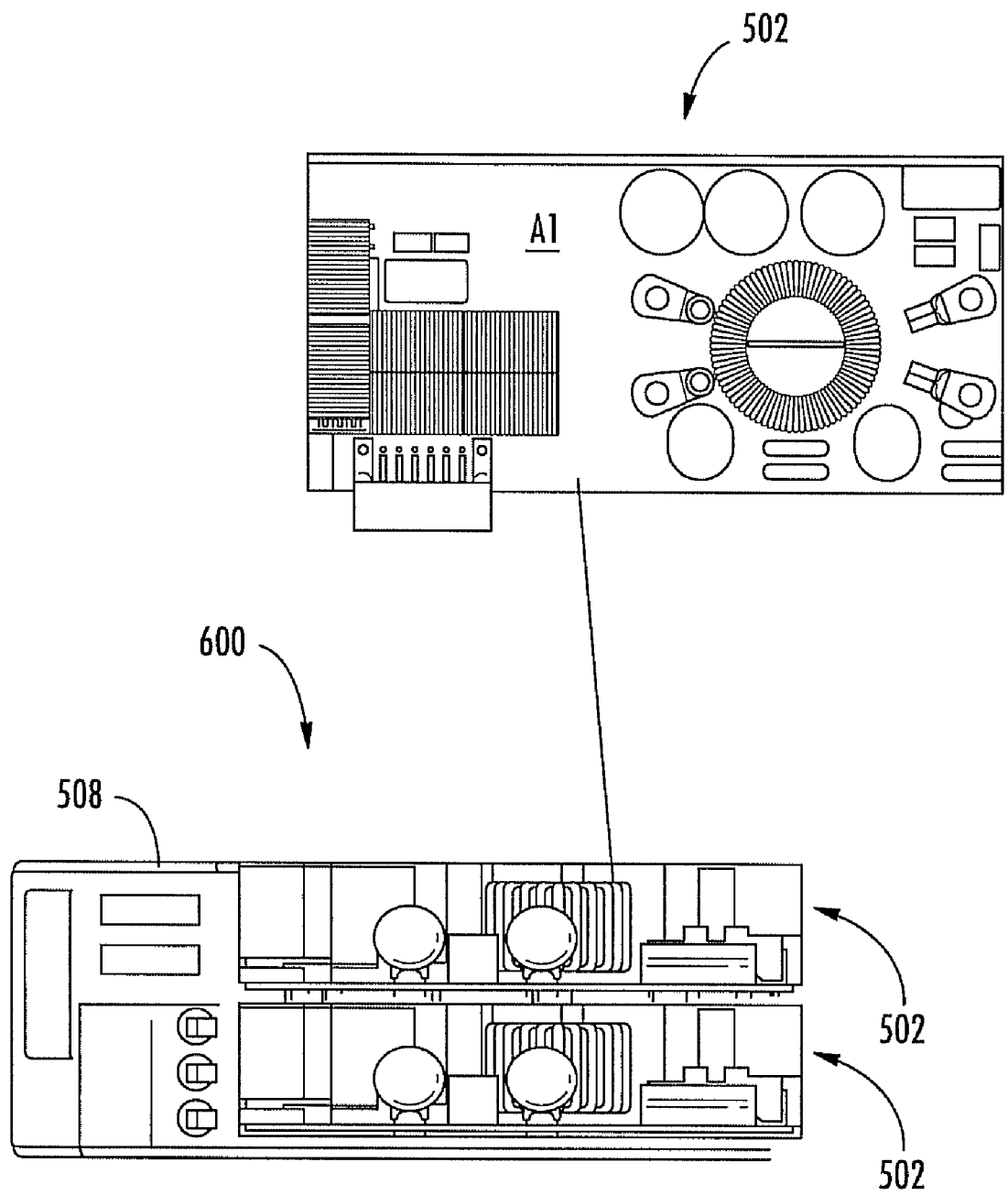
FIG. 6 is a diagram of the modules in FIG. 5 configured in a stacked configuration with one module on top of another module according to an exemplary embodiment of the present invention.

Referring to FIG. 6, each of the modules 502 is configured in a stacked configuration 600 with one module 502 on top of another module 502. FIG. 6 illustrates a top view of the module 502 and a cut away front view of the modules 502 in the stacked configuration in the chassis 508. The stacked configuration 600 enables the large-sized PDU module 500 to provide power connections to multiple shelves in a rack.

Figure 7:
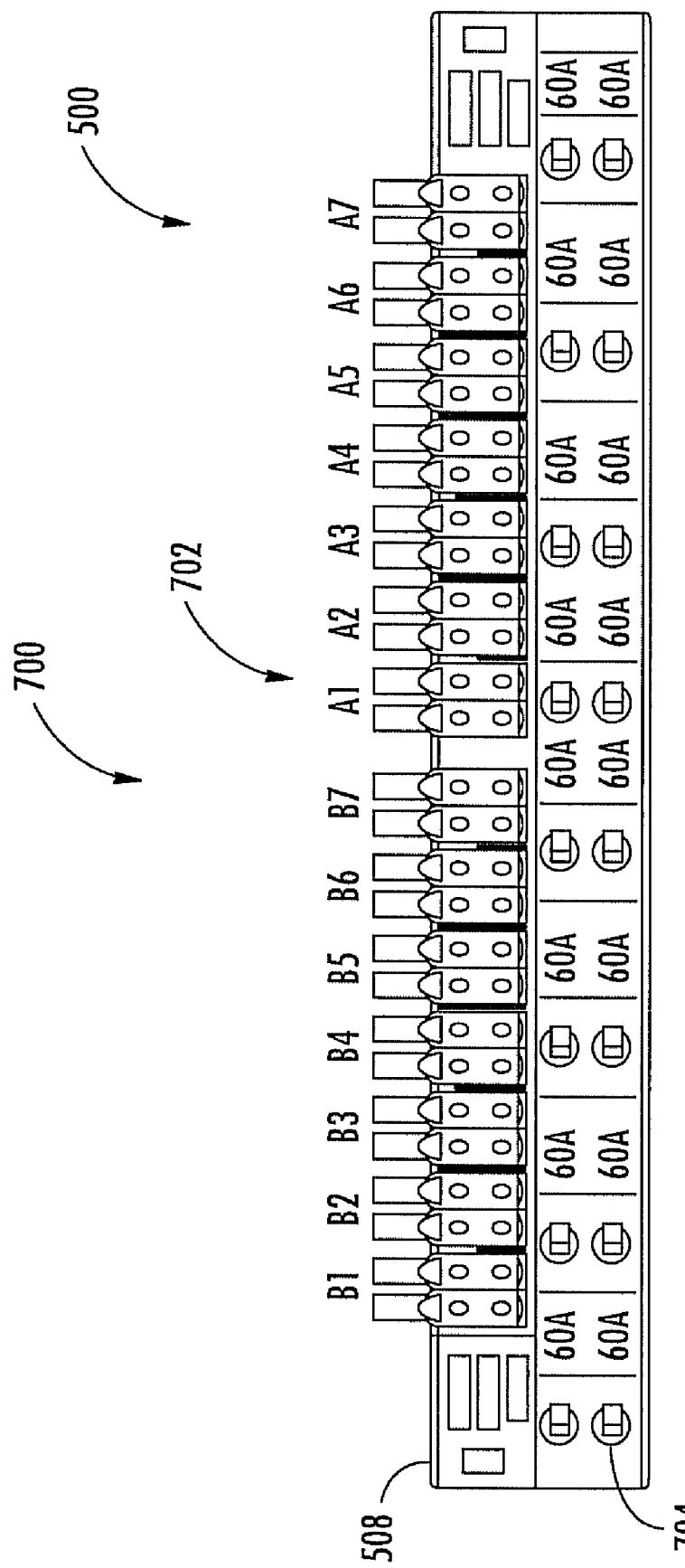
FIG. 7 is a diagram of a rear view of the chassis of the large-sized PDU module according to an exemplary embodiment of the present invention.

Referring to FIG. 7, a rear view 700 is illustrated of the chassis 508 of the large-sized PDU module 500 according to an exemplary embodiment of the present invention. The chassis 508 is illustrated with seven dual feed power connections 702. These connections 702 provide filtered power from the PDU module 500 to multiple shelves. The chassis 508 also include multiple 60A circuit breakers 704.

Figure 8:
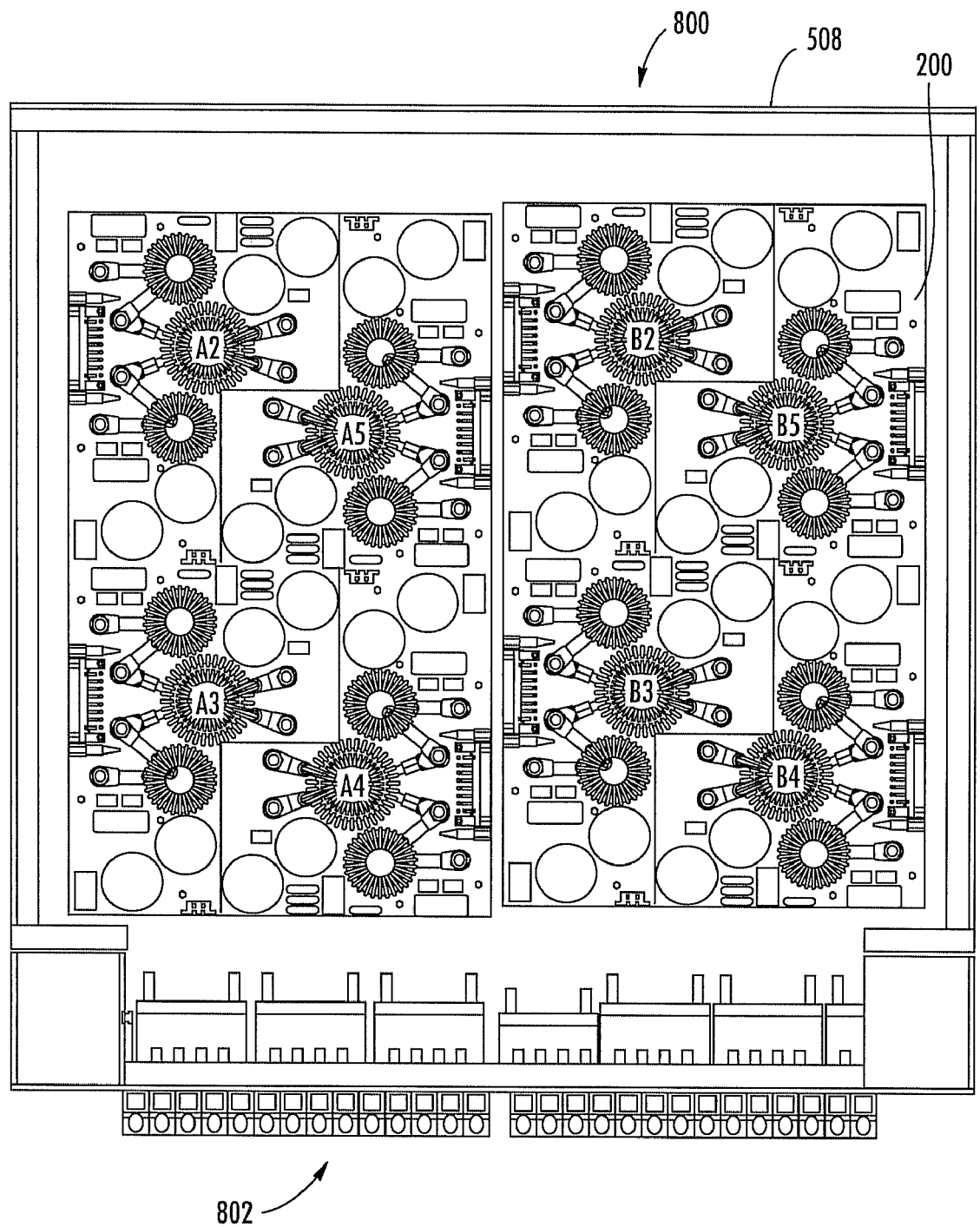
FIG. 8 is a diagram of a large-sized PDU module with a combination of eight L-shaped filter modules in the chassis according to an exemplary embodiment of the present invention.

Referring to FIG. 8, a large-sized PDU module 800 is illustrated as a combination of eight L-shaped filter modules 200 in the chassis 508 according to an exemplary embodiment of the present invention. The eight L-shaped filter modules 200 are interconnected to fit with the chassis 508. Additionally, twelve circuit breakers 802 are includes at the rear of the chassis 508.

Referring to FIG. 9, a PCB 900 illustrates a six layer construction design for filter modules 200, 502 for the various boards described herein according to an exemplary embodiment of the present invention. The modular PCB designs used in the PDUs of the present invention were optimized to allow for the maximum current flow for each of power nets while maintaining the 1000V DC voltage isolation between power and ground nets (0.07" outer layer and 0.008" inner rules empirically determined) specified in safety requirements including IEC60950 and Bellcore GR78. These requirements led to the design of the filter modules 200, 502 that both use the six layer construction of the PCB 900. In an exemplary embodiment, a first layer on the PCB 900 includes 3 oz. of foil which is 4 oz. finished after plating (0.0056" thick). A second through fifth layer include 3 oz. of foil (0.0039" thick). A sixth layer includes 3 oz. of foil which is 4 oz. finished after plating (0.0056' thick). FR406 is the PCB 900 base material where FR means flame retardant and 406 is related to the dielectric that provides optimal EMI filter performance.

A circuit analysis was performed of the net distribution of the L-shaped filter module 200, and the current was distributed as described in the following table: The first row in table below indicates that the −48V signal conducts on two of the four inner layers of the PCB 900 occupying 4 square inches on each layer. In additional the −48V signal conducts on both outer layers of the PCB 900 occupying 3 square inches on each layer. These wide conduction areas conduct heat and prevent the PCB 900 from failing under extreme conditions such in an 80 A fault occurred at the load.

| Signal | Current | Inner Layers/ Square Inches | Top and Bottom Layer Square Inches |
|---|---|---|---|
| −48 V | 80 | 2 layers/4 | 3 square inches |
| Pos Return | 80 | 2 layers/4 | 3 square inches |

Figure 10:
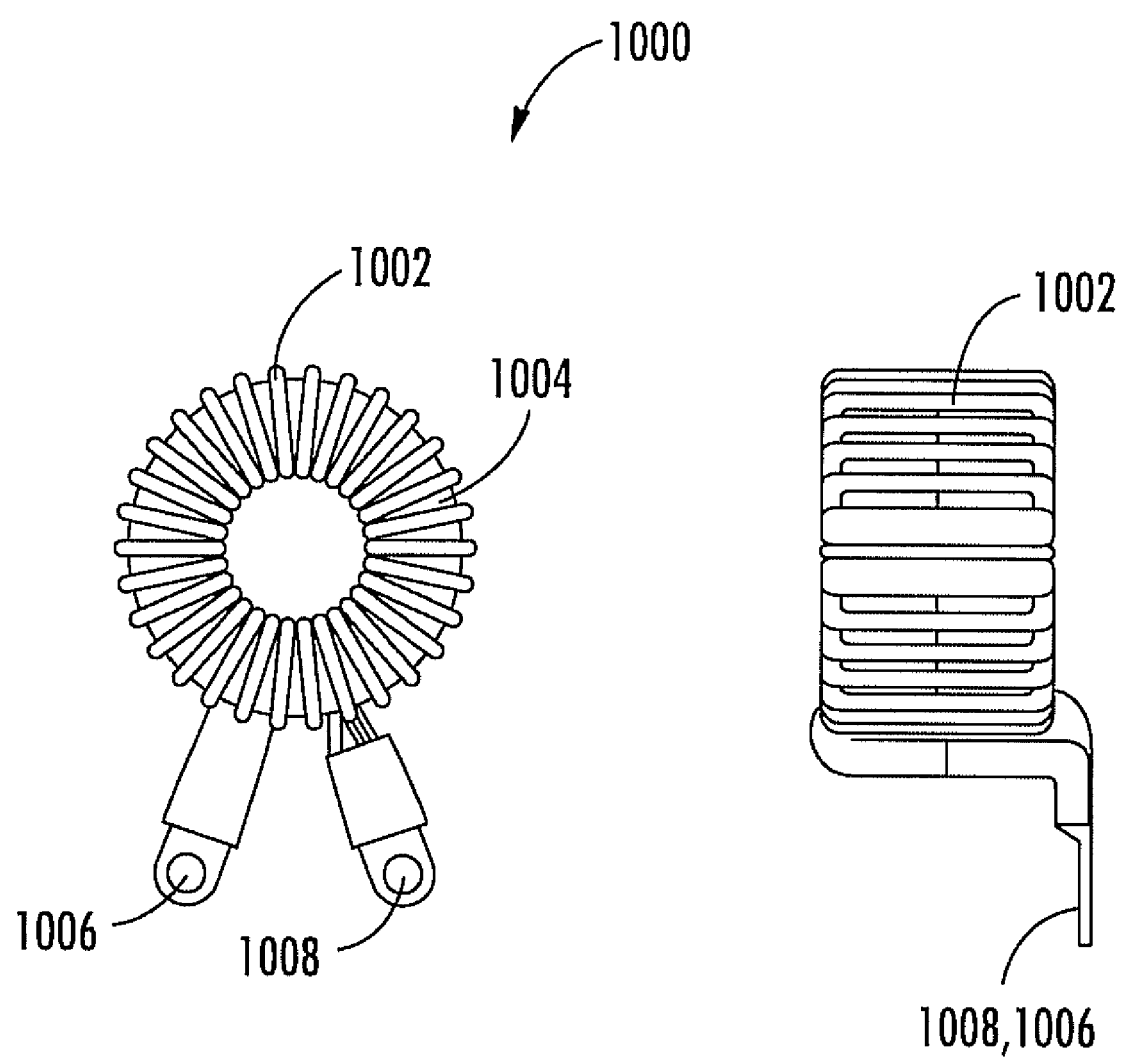
FIG. 10 is a diagram of an inductor for providing filtered power up to 80 A for line modules and fan assemblies in a shelf or rack applications while limiting differential mode emission levels according to an exemplary embodiment of the present invention.

Referring to FIG. 10, an inductor 1000 is illustrated to provide filtered power up to 80 A for line modules and fan assemblies in a shelf or rack applications while limiting differential mode emission levels according to an exemplary embodiment of the present invention. FIG. 10 illustrates a top and side view of the inductor 1000. The inductor 1000 can be utilized as the inductor 216 in the various embodiments described herein. In an exemplary embodiment, the inductor 1000 includes five conductors 1002 of 13 AWG wires with a coating rated at 150 degrees Celsius or greater and 20" long covered with shrink tube insulation. A core 1004 includes 10 turns with inductance at 100 kHz between 2 µH and 25 µH. The inductor 1000 also includes two ring tongue terminals 1006, 1008 which are soldered to a circuit board and provide connections to the inductor 1000.

Figure 11:
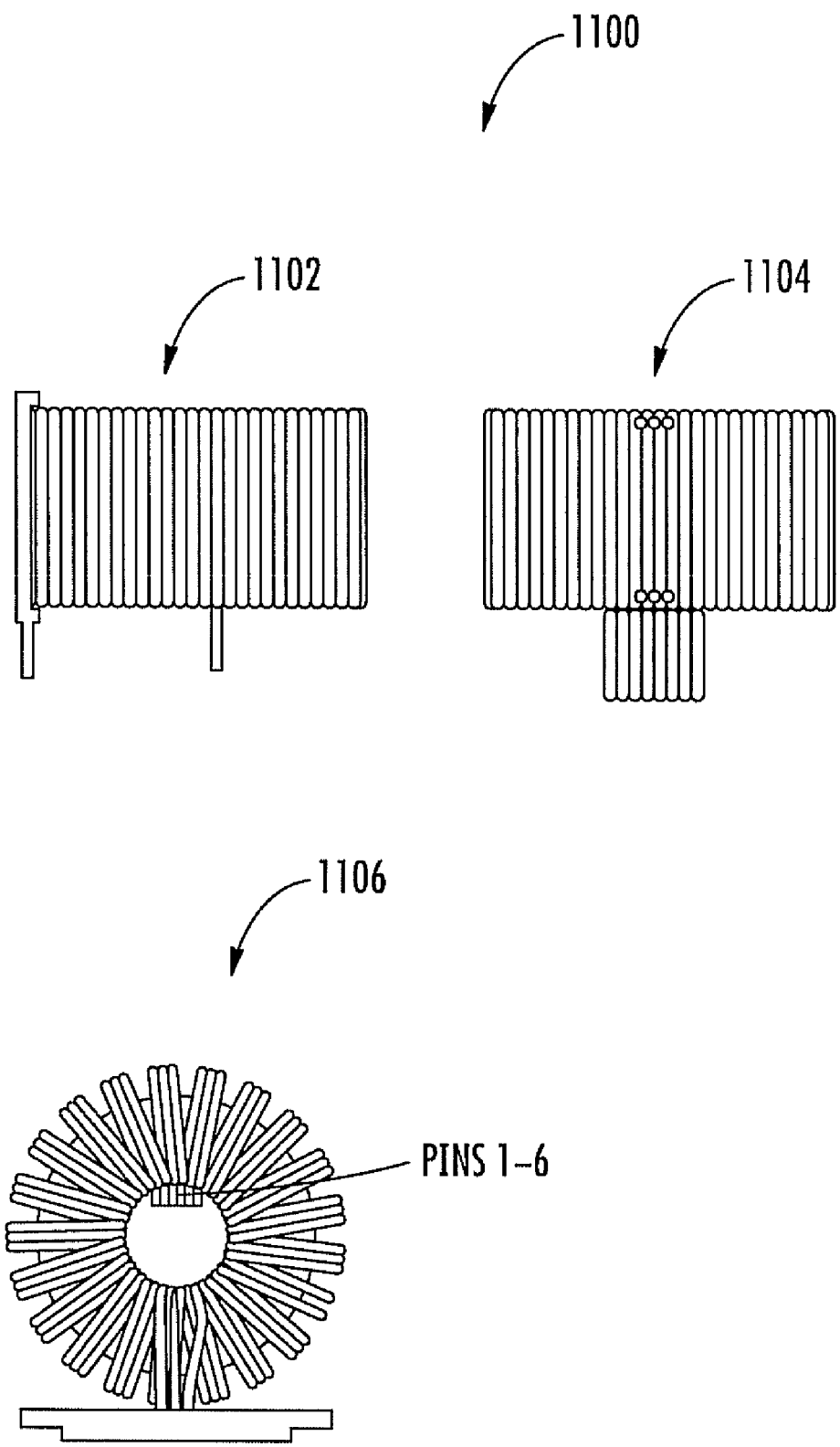
FIG. 11 is a diagram of an inductor for providing two 40 A filtered power feeds when used in a pair for a rack system while limiting differential mode emission levels according to an exemplary embodiment of the present invention.

Referring to FIG. 11, an inductor 1100 is illustrated to provide two 40 A filtered power feeds when used in a pair for a rack system while limiting differential mode emission levels according to an exemplary embodiment of the present invention. FIG. 11 illustrates a top view 1102, a side view 1104, and a bottom view 1106 of the inductor 1100. The inductor 1100 can be utilized as the inductor 216 in the various embodiments described herein. In an exemplary embodiment, the inductor 1100 includes pins with 10 turns of wires wound clockwise starting from pin 1 through 6 to pins 7 through 12 for a total of 10 windings. The inductor 1100 can provide inductance at 22 µH at 1 kHz.

Figure 12:
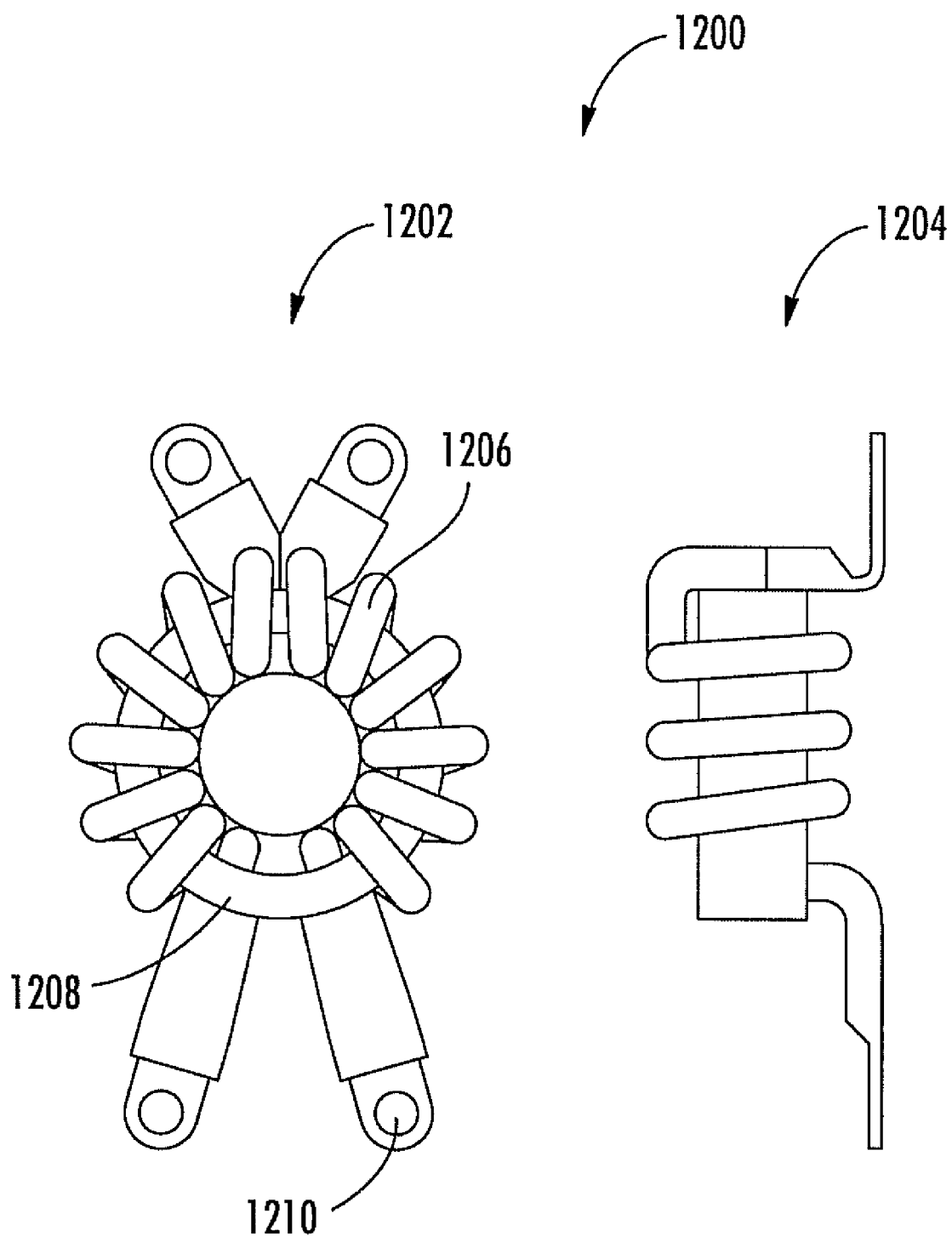
FIG. 12 is a diagram of a common mode transformer configured to feed 80 A to fans and shelves in a rack while limiting common mode emission levels according to an exemplary embodiment of the present invention.

Referring to FIG. 12, a common mode transformer 1200 is illustrated to feed 80 A to fans and shelves in a rack while limiting common mode emission levels according to an exemplary embodiment of the present invention. FIG. 12 illustrates a top view 1202 and a side view 1204 of the common mode transformer 1200. The common mode transformer 1200 includes five conductors 1206 of 13 AWG wires. The common mode transformer 1200 also includes a core 1208 and four ring tongue terminals 1210 which are soldered to a circuit board and provide connections to the common mode transformer 1200. The common mode transformer 1200 provides inductance at 100 kHz between 0.4 mH and 0.75 mH.

The custom magnetic parts 1000, 1100, 1200 used include sixteen differential mode inductors designed using high flux cores that have 50% nickel content and offer the greatest permeability under DC bias conditions of any material available in the least amount of space. The use of these cores and custom windings and stacking that allowed for the fewest number of windings to obtain the needed inductive reactance while minimizing the space needed. Two different types of these vertically mounted differential mode filters were designed and the temperature rise under 40 A or 80 A load conditions were less then 55 degrees C. The PDU also uses one common mode transformer on each feed that is designed for vertical mounting using a very high permeability core (W material) made of MN-ZN with an initial value of 10000. Testing indicated that this material allowed for the fewest number of windings to obtain the needed common mode inductive reactance over the frequency range of interest while minimizing the PCB space needed to mount the part. The worst-case temperature rise for this CM choke under 80 A load conditions was less then 55 C under zero air flow conditions. The magnetic cores used for all three types of filter parts are commercially available through Magnetics or Arnold.

This application is unique because the PDU is being used to supply high current filtered power to up to 63 modules and 40 fan assemblies in a single rack without the need of fans to cool the PDU filter circuits. These modules in the most dense rack configuration can contain up to eight 10 G channels that corresponds to a rack or equipment being able to process in excess of 4.8 Tb/s that is up to a factor eight times greater than any conventional telecom/datacom system.

The circuits used in the PDU were designed for high reliability with a Mean Time Before Failure (MTBF) design goal of greater than 200,000 hours per feed. For example, a system configuration could include eight PDU modules having a requirement that each module have 1.6 million hour MTBF or greater. An analysis and calculations have indicted that the modular PDU design exceeds the design goal. The worst-case MTBF analysis considered the specified de-rating of components at both the maximum electrical load current (at lowest input voltage) as well as operation at the maximum input voltage levels.

By designing a module PDU not only to provide circuit protection but also provide necessary broadband filtering at the feed location, a significant space is saved on the modules that process signal in excess of 10 GHz was realized. Prior to the modular PDU design the panels that feed power to the telecommunication shelves in a rack had very limited filter performance because of a need for a fan to cool filter elements. Fan reliability is relatively low and fans as well as air filters need scheduled replacement. The stringent space constraints, MTBF and redundancy requirements for telecommunications equipment could not be met with cost effective fans. The convection cooled PDU meets all reliability requirements and takes up the same rack space as most fuse and breaker panels that have little or no power filtering capability.

A major problem associated with expensive telecommunications modules that contain microwave circuits and lasers is that the state of the art circuits use considerable power to achieve higher data rates and require much greater cooling. The result is that higher power sources are required that operate at higher frequencies and create greater emission levels. In addition the customer base has changed from just telecom central office applications to enterprise customers that have much narrower rack that will not fit wide shelves so density on module must increase. In addition the fans of much greater power are required to cool these circuits and the EMI is much great. The space taken up by power filter circuits on high density signal processing modules and fan controllers filter circuits needed to meet these requirements requires an increase in filter poles (component) and larger space for magnetic and capacitor components are needed that would limit PWB density. The result is that more rack units are needed for these signal processing modules and fans that ultimately limits the system data processing rates and bandwidth.

Without a PDU with adequate filter capability, the shelf or rack module power is limited (losses associated with magnetic elimination) as is the capabilities for processing at higher data rates. The problem with designing adequate filtering at the PDU was that the feed current is very high and cooling the filter elements was very difficult without fans in a limited space. The present invention of a PDU that can provide redundant 500 A feed and takes up just two Rack units requires much less space then a protection only PDU (2 RU) with filtering at each module in the rack would require. The design techniques described in this disclosure have been proven reliable based on testing to specifications including NEBS GR63, GR78, GR 1089, IEC 60950, ETSI 300-132-2 and IEC 300-386. The specifications include requirements for ESD immunity, conducted emissions and immunity, radiated immunity and emissions, EFT, surge, vibration, shock, temperature cycle, humidity, power fault and inrush current.

Figure 13:
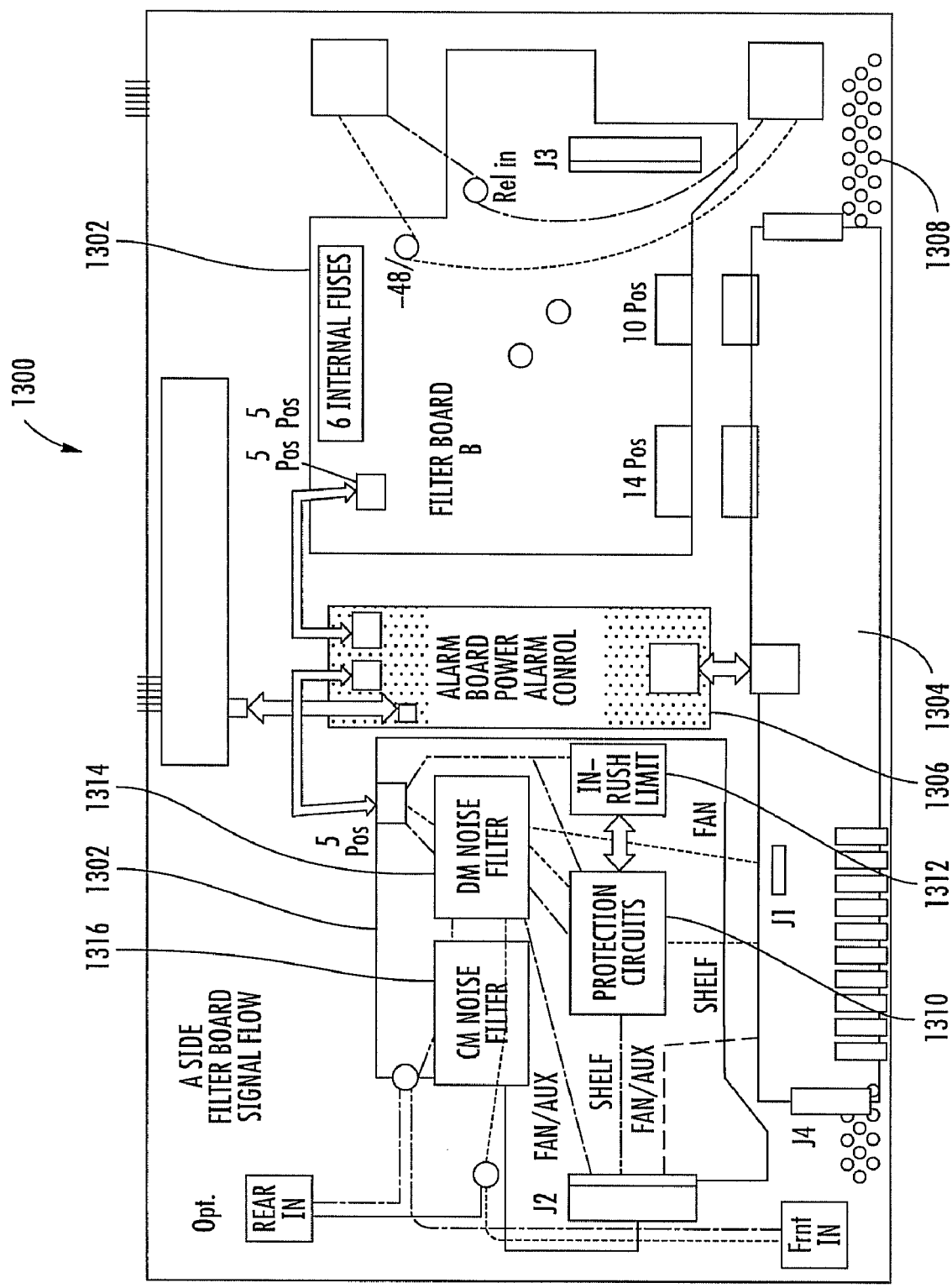
FIG. 13 is a functional block diagram of a Power Distribution Unit (PDU) module with EMI filtering according to an exemplary embodiment of the present invention.

Referring to FIG. 13, a functional block diagram illustrates a Power Distribution Unit (PDU) module 1300 with EMI filtering according to an exemplary embodiment of the present invention. The PDU module 1300 is configured to supply −48 VDC CO power to rack mounted equipment, such as shelves and other components, and to provide summary alarms for the system. The PDU module 1300 functions include system level over voltage transient protection from the CO environment, system level surge current protection from the CO environment, system level common mode filtering to control emissions and insure conducted immunity from the CO environment, system level differential mode filtering to control emissions and insure conducted immunity between the rack shelves as well as with other equipment in the CO environment, and a soft-start feature to limit the current surge otherwise cause by the PDU differential mode filter capacitor charging circuits.

Figure 14:
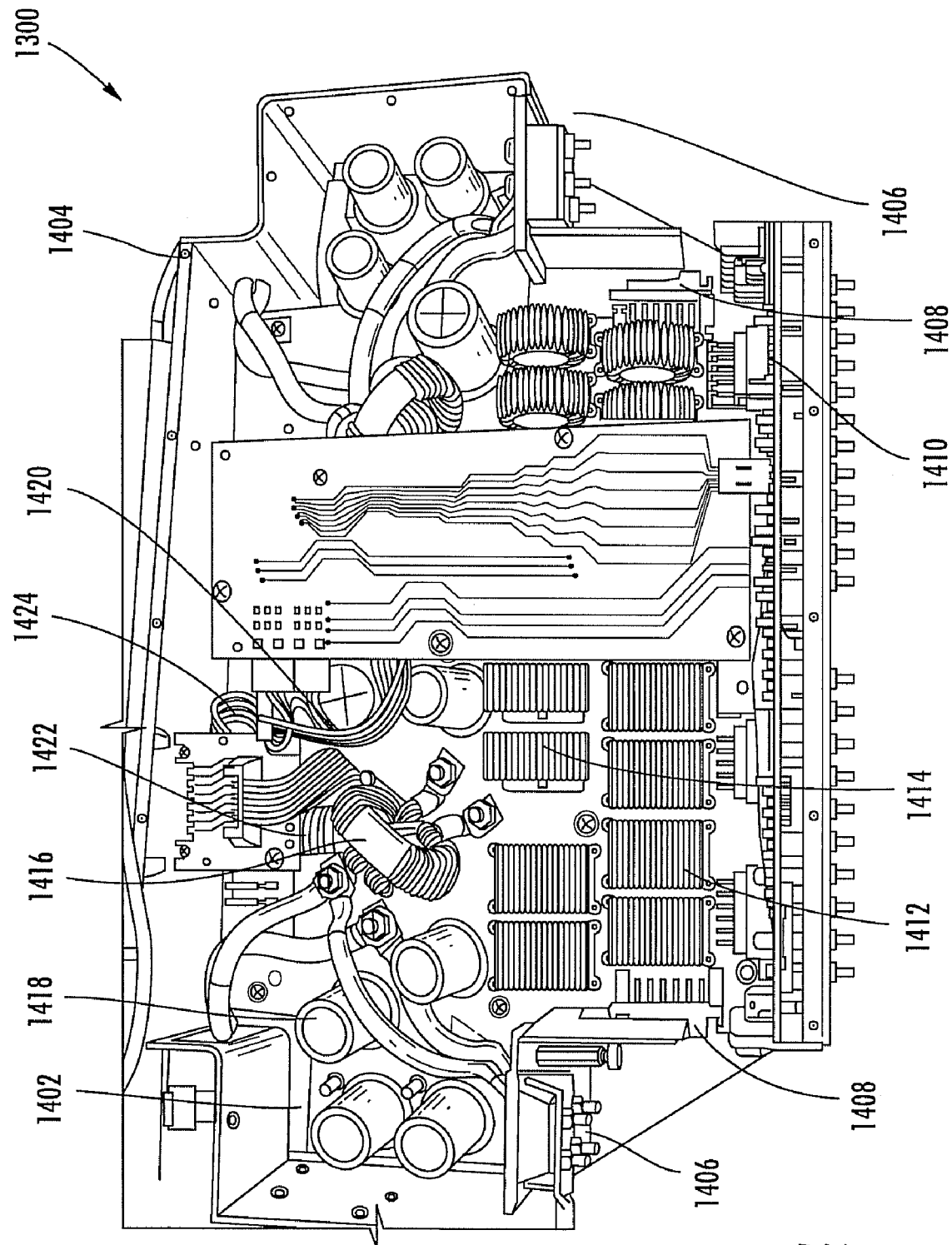
FIG. 14 is a diagram of an exemplary embodiment of the PDU module of FIG. 13 with EMI filtering according to an exemplary embodiment of the present invention.

The PDU module 1300 contains of two independent filter power circuit boards 1302 that feed a vertically mounted board 1304 that includes fuses, interface connectors and status indicator LED. A control board 1306 that performs alarm signal processing connects to the three other boards 1302, 1304. The PDU module 1300 is designed to be air cooled through natural convection. The fuse area is the only area with bottom perforations 1308 in a chassis designed for natural air flow from below the PDU module 1300 to exhaust out the top. Each circuit board 1302 includes protection circuits 1310, in-rush current limiting circuits 1312, a DM noise filter 1314, and a CM noise filter 1316. The protection circuits 1310 include voltage protection is provided by suppression devices 1422 (FIG. 14). The CM noise filter 1316 components included the transformer 1416 (FIG. 14), and film capacitors 1420 (FIG. 14). The CM noise filter 1316 is provided by suppression devices 1422 (FIG. 14). The DM noise filter 1314 components include the inductors 1412, 1414, electrolytic capacitors 1418 and film capacitors 1424 as well as SMT parts on the underside of the PCB 1402 (FIG. 14).

The PDU module 1300 is configured to provide highly efficient system level EMI filtering in an 80 A dual feed configuration using custom magnetic components that are designed to provide excellent performance under various load conditions. The custom magnetic components provide the necessary EMI filtering at all frequencies in the range between 200 Hz and 200 MHz under all load conditions including a single feed failure. Filtering at a PDU system level is a key feature that provides improved packaging density at the circuit pack level while improving system reliability. Additionally, integral to the EMI filter design, cooling of the EMI components uses a combination of natural convection and conduction techniques at the board level ensuring no loss of EMI filtering performance.

The combined natural convection and conduction cooling techniques include features that are compliant with various safety and EMC agency requirements. These proven high reliability cooling techniques used in this invention include a combination of features including PCB copper pours that are located on six layers of the circuit boards, standoff fuse holders, custom filter parts that sink heat in the PCB and perforation located for optimal cooling while meeting the safety compliance opening requirements. All these features are contained in a two Rack Unit (17.75" wide and 2 RU height 3.5") chassis assembly that can fit in a 19"EIA, 300 mm deep ETSI and 23" NEBS. The custom PCB and metal parts work in combination with component parts to provide two 80 A filter circuits that take up less then two Rack Units (RU) of space. The PDU supplies electrical connection to the three shelves of modules and up to 15 fan circuits in a rack that are all electrically isolated through filters that are rated at greater than 20 amps each.

These filters need to be effective at frequencies as low as 200 Hz to over 200 MHz for reliable operation as well as regulatory compliance. At the lower frequencies components are large and take up valuable board space as well as create heat that needs to be removed. At higher frequencies the capacitors need to be connected to a low impedance ground path while meeting 1000V standoff requirements. In the case of a next generation DWDM system with three shelves containing up to 21 data processing modules and 5 fan modules per shelf, for example, a rack requires a total 78 filter circuits on these modules. The advantage of the traditional method of putting the filter networks on the modules is that the modules are cooled using redundant fans to meet reliability requirements. There are numerous disadvantages in placing that many filter circuits on modules including the fact that the approach takes up considerable space and the number of data channels in a rack is therefore limited. In addition to saving board space the cooling of the lower frequency filter components are removed from the module that allows for more powerful signal processing components being placed on modules. By placing the filters in the power unit a significant space saving is realized on modules and valuable rack space usage is maximized. This enhanced EMI filtering approach has contributed to a planned rack level data processing rate increase by up to a factor of eight. The use of convection cooling of the PDU was needed because the use of replaceable redundant fans in the PDU is too costly in terms of space taken up and system reliability. This present invention is based on convection cooling using PCB design in combination with custom parts and components that negate the need to use fans for filter element cooling altogether and eliminating the costs associated with spare fans or additional racks to install more 10 G data channel modules if the filtering is done remotely as in past designs.

The PDU module 1300 can be used to supply high current filtered power to up to 63 modules and 15 fan assemblies in a single rack without the need of fans to cool the PDU filter circuits. Sixty of the modules in the most dense rack configuration can contain up to eight 10 G channels that corresponds to a rack or equipment being able to process in excess of 4.8 Tb/s.

The PCB designs used in the PDU module 1300 were optimized to allow for the maximum current flow for each of power nets while maintaining the 1000V DC voltage isolation between power and ground nets (0.09" outer layer and 0.06" inner rules empirically determined) specified in safety requirements including IEC60950 and Bellcore GR78. In addition to these requirements, the PDU module 1300 interface board was designed to allow 160 A of total filtered current to flow while providing 1500V DC of isolation from alarm circuit nets on the PCB nets (0.1" outer layer and 0.08" inner rules empirically determined). These requirements led to the design of the two filter boards and one I/O board that all used the 6 layer stack-up shown in FIG. 9. The board construction was used in combination with empirically determined placement of critical components such as long lead fuse holders that are spaced 0.562' off the I/O board and in a location above Safety agency compliant perforations to allow for the convective removal of heat from this major source in the PDU module 1300.

Referring to FIG. 14, a diagram illustrates an exemplary embodiment of the PDU module 1300 with EMI filtering according to an exemplary embodiment of the present invention. FIG. 14 illustrates custom cooling thermal design features of the PDU module 1300 including custom parts, connections, component placement, PCB design, and air flow features. The PDU module 1300 includes an A-side filter board 1402, a B-side filter board 1404, a power in connection 1406, and a power out connection 1408. The connections 1406, 1408 include custom cable/connector assemblies for dual power feeds, i.e. A and B feeds.

The PDU module 1300 also includes fuses and fuse holders 1410 for conducting 160A of filtered current from the A-side filter board 1402 and the B-side filter board 1404 to shelves. The fuse holders 1410 are spaced off of the A-side filter board 1402 and the B-side filter board 1404 to force convection cooling.

The filtering components of the A-side filter board 1402 and the B-side filter board 1404 include custom magnetic components, such as a 20 A DM EMI shelf filter choke 1412, a 25 A DM EMI fan filter choke 1414, and an 80 A CM EMI filter transformer 1416. The transformer 1416 is the magnetic components of the CM Noise filter 1316, the inductors 1412 and 1414 are parts of the DM noise filter 1314, and the in-rush limit circuit is located on the bottom side of the PCB 1402.

Figure 15:
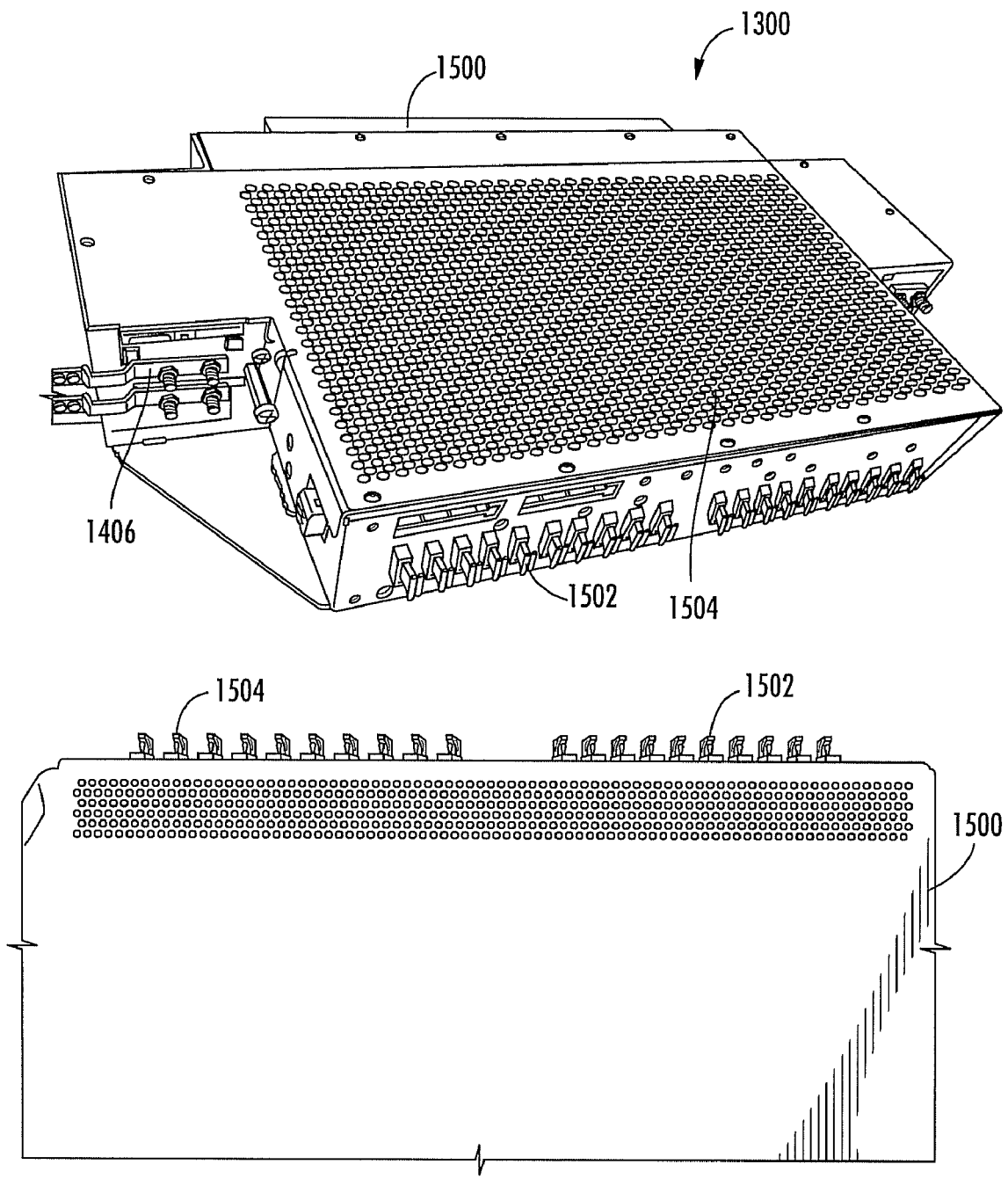
FIG. 15 is a diagram of a case of the PDU module 1300 of FIG. 13 with EMI filtering according to an exemplary embodiment of the present invention.

Referring to FIG. 15, a case 1500 is illustrated for the PDU module 1300 with EMI filtering according to an exemplary embodiment of the present invention. FIG. 15 illustrates a top and bottom view of the case 1500. The case 1500 includes the power in connection 1406, a plurality of fuses 1502, and a perforation pattern 1504. The perforation pattern 1504 is designed to enable air flow for convection cooling of the PDU module 1300. The air flow is concentrated around the fuses 1502 because these are a major source of heat in the PDU module 1300.

Figure 16:
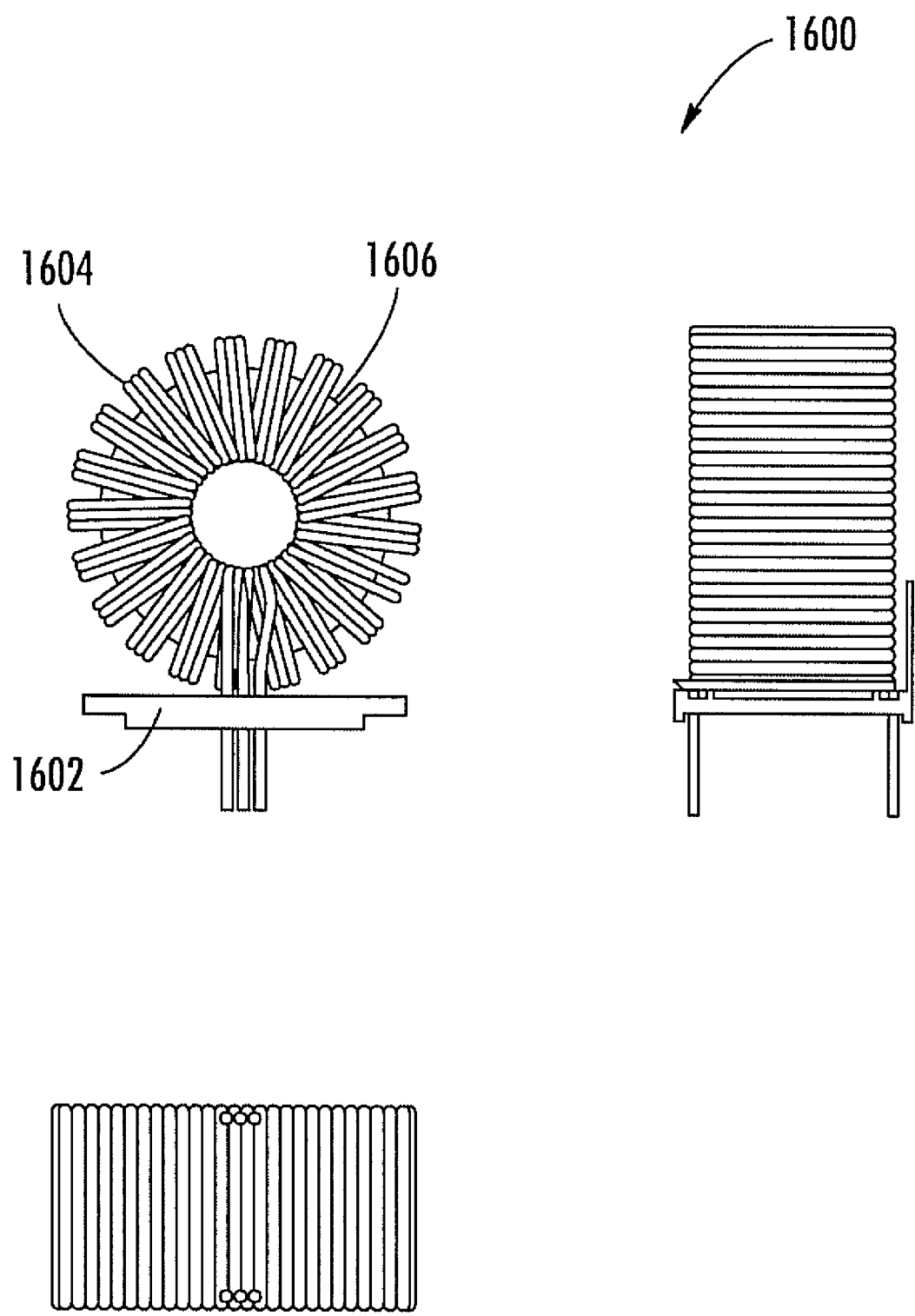
FIG. 16 is a diagram of an inductor for providing filtered power up to 15 A for fan assemblies in a shelf or rack applications while limiting differential mode emission levels according to an exemplary embodiment of the present invention.

Referring to FIG. 16, an inductor 1600 is illustrated to provide filtered power up to 15 A for fan assemblies in a shelf or rack applications while limiting differential mode emission levels according to an exemplary embodiment of the present invention. FIG. 16 illustrates a front, a side, and a bottom view of the inductor 1600. The inductor 1600 includes 18 turns of three wires wound clockwise staring from pins for a total of 18 windings. The inductor 1600 provides 52 uH at 1 kHz +/−10%. The inductor 1600 includes a base 1602, windings 1604, and a magnetic core 1606.

Figure 17:
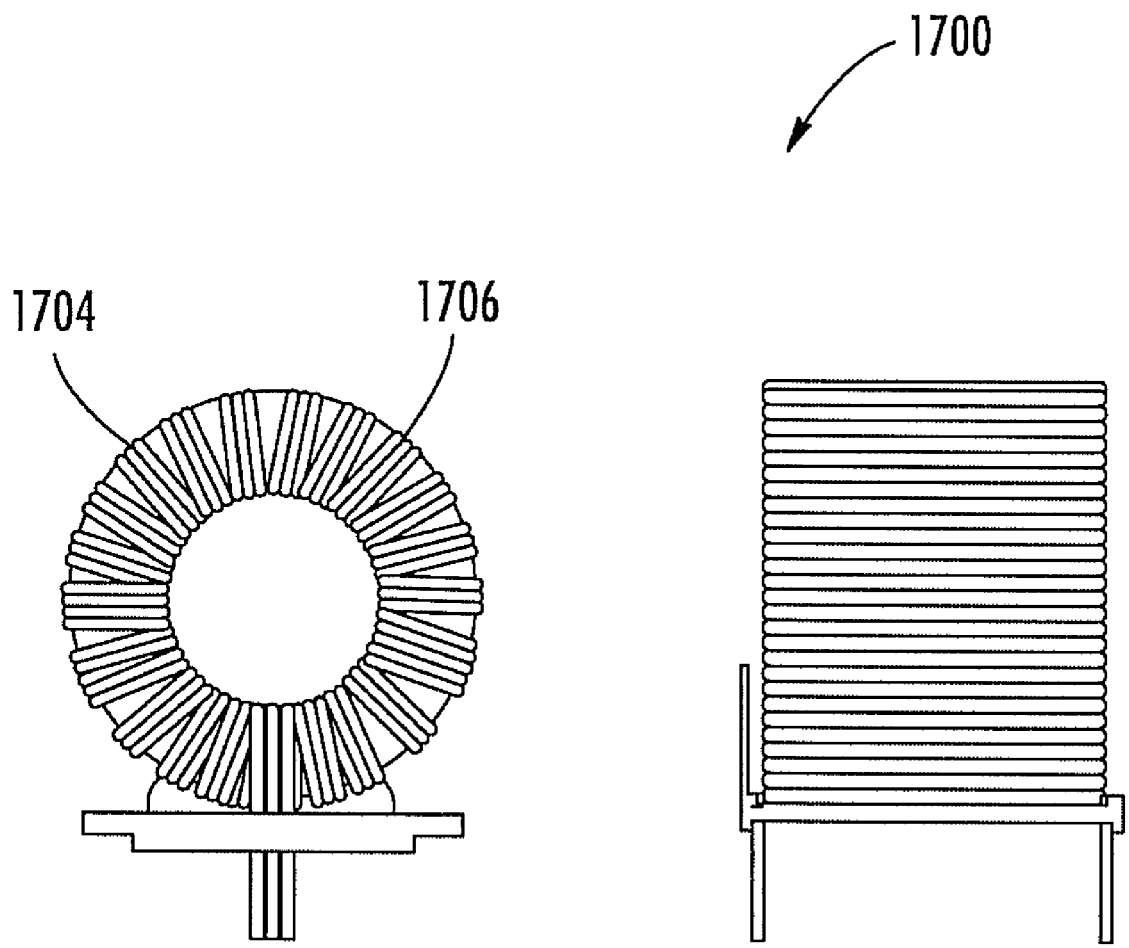
FIG. 17 is a diagram of an inductor for providing filtered power up to 20 A of power to both shelf feeds on three shelves in a rack while limiting differential mode emission levels according to an exemplary embodiment of the present invention.

Referring to FIG. 17, an inductor 1700 is illustrated to provide filtered power up to two shelf feeds on any of three shelves in a rack while limiting differential mode emission levels according to an exemplary embodiment of the present invention. FIG. 17 illustrates a front, a side, and a bottom view of the inductor 1700. The inductor 1700 includes 21 turns of three wires wound clockwise staring from pins for a total of 21 windings. The inductor 1700 provides 100 uH at 1 kHz +/−10%. The inductor 1700 includes a base 1702, windings 1704, and a magnetic core 1706.

Figure 18:
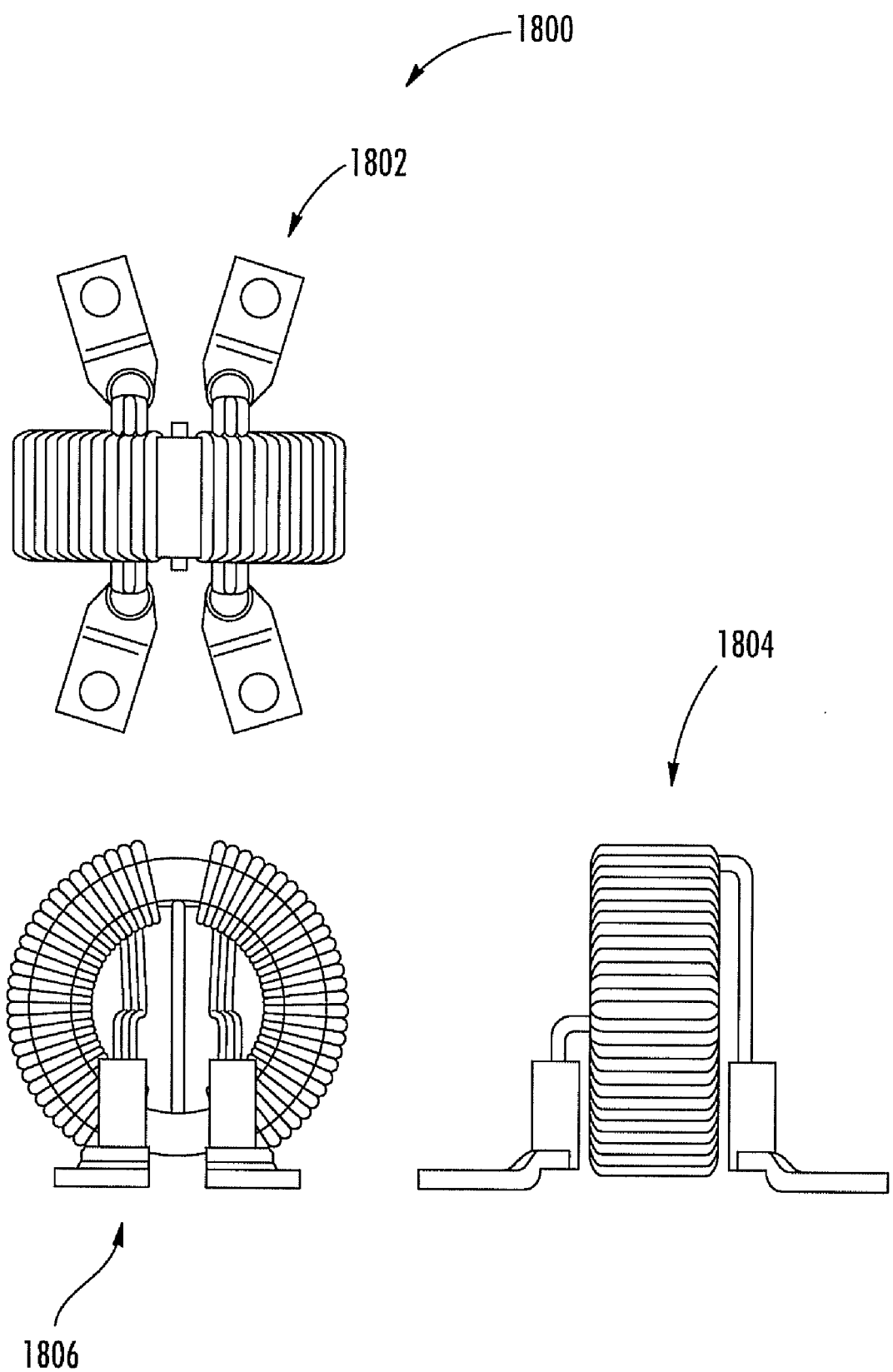
FIG. 18 is a diagram of a common mode transformer for feeding 80 A to fans and shelves in a rack while limiting common mode emission levels according to an exemplary embodiment of the present invention.

Referring to FIG. 18, a common mode transformer 1800 is illustrated to feed 80A to fans and shelves in a rack while limiting common mode emission levels according to an exemplary embodiment of the present invention. FIG. 18 illustrates a top view 1802, a side view 1804, and a front view 1806 of the common mode transformer 1800. This transformer was designed vertically to minimize PCB surface area and use all available space above the PCB to maximize cooling.

The custom magnetic parts 1600, 1700, 1800 used include sixteen differential mode inductors designed using high flux cores that have 50% nickel content and offer the greatest permeability under DC bias conditions of any material available in the least amount of space. The use of these cores and custom windings and stacking that allowed for the fewest number of windings to obtain the needed inductive reactance while minimizing the space needed. Two different types of these vertically mounted differential mode filters were designed and the temperature rise under 20 A load conditions were less then 30 degree C. The PDU module 1300 also uses one common mode transformer 1800 on each feed that is designed for vertical mounting using a very high permeability core (W material) made of MN-ZN with an initial value of 10000. Testing indicated that this material allowed for the fewest number of windings to obtain the needed common mode inductive reactance over the frequency range of interest while minimizing the PCB space needed to mount the part. The worst-case temperature rise for this CM choke under 80 A load conditions was less then 30 C under zero air flow conditions. The magnetic cores used for all three types of filter parts are commercially available through Magnetics or Arnold.

Figure 19:
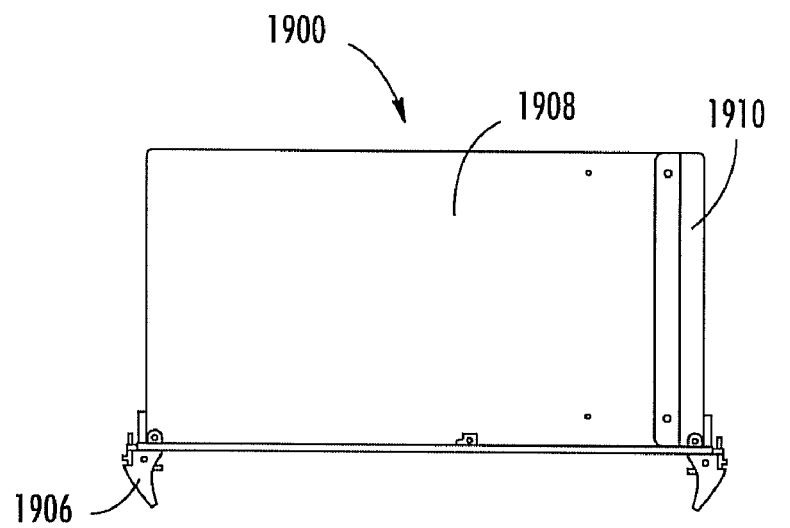
FIG. 19 is a diagram of a blank panel for directing air flow to components on printed wiring boards (PWBs) for a shelf according to an exemplary embodiment of the present invention.
Figure 19:
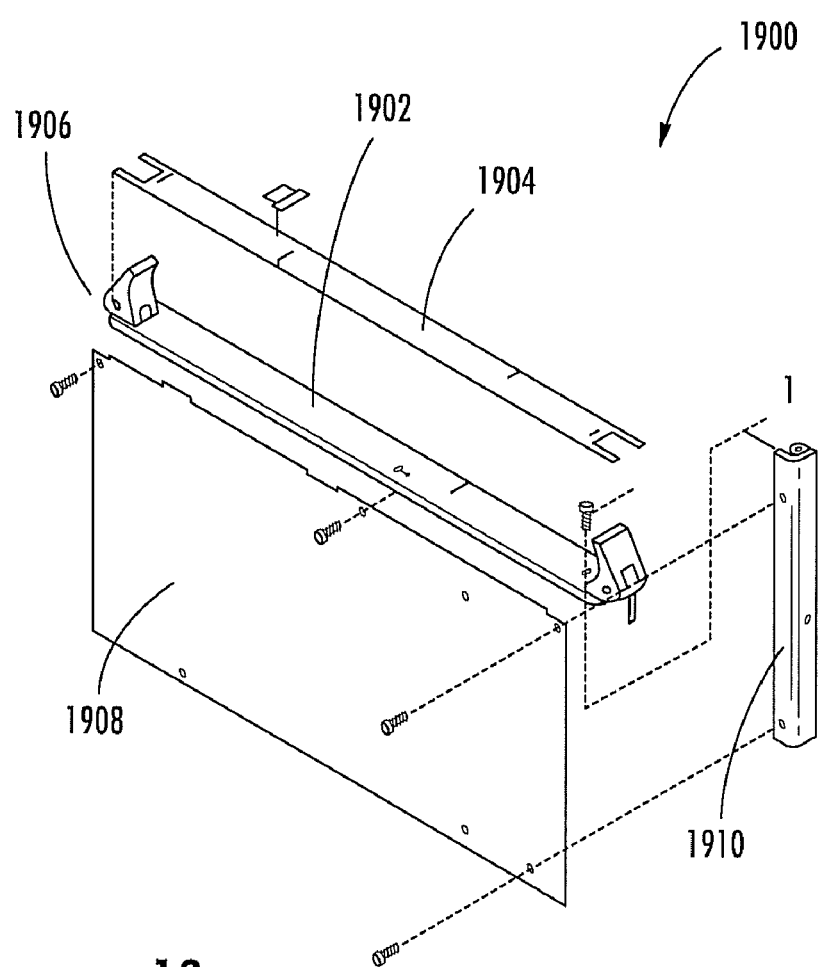

Referring to FIG. 19, a blank panel 1900 for directing air flow to components on printed wiring boards (PWBs) for a shelf is illustrated according to an exemplary embodiment of the present invention. The blank panel 1900 is utilized to direct air flow to components on printed wiring boards (PWB's). The blank panel 1900 can be made of formed Aluminum alloy sheet metal pieces. The blank panel 1900 is a single slot assembly configured to insert into an unoccupied slot on a telecom rack. FIG. 19 illustrates a front, side, and diagonal view of the blank panel 1900.

The blank panel 1900 includes a front faceplate 1902 optionally with a front face label 1904 for identifying the blank panel 1900. The front faceplate 1902 includes latches 1906 for securing the blank panel 1900 in a telecom rack. The front faceplate 1902 is attached to a plate 1908. The plate 1908 is also supported by a vertical support 1910 which is attached to the front faceplate 1902 and the plate 1908.

The plate 1908 is connected to the vertical support 1910 at angles determined to provide the optimal air-flow over components on PWBs in the shelf. The plate 1908 includes a Restriction of Hazardous Substances Directive (ROHS) compliant conductive finish Aluminum panels that also provide structural integrity and EMI shielding needed for telecom shelves. The faceplate 1902 is bonded to the shelf/chassis as well as adjacent panels though environmental proven compliant EMI gaskets that have a environmentally proven effective conductive finish and is attached using PSA on all four surfaces of the faceplate.

Figure 20:
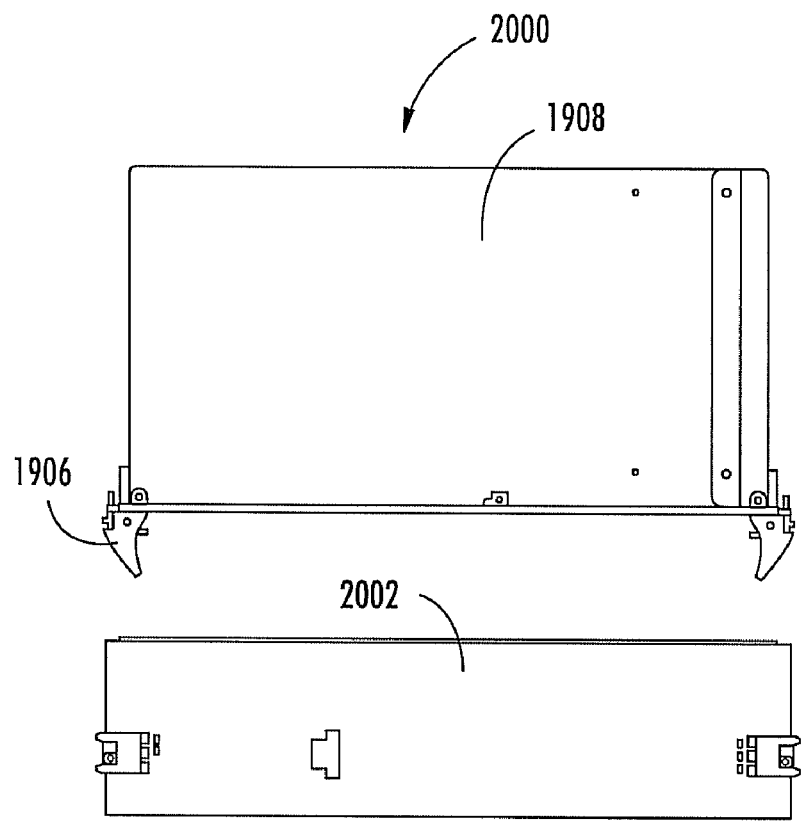
FIG. 20 is a diagram of a four-slot blank panel for directing air flow to components on PVVBs for a shelf according to an exemplary embodiment of the present invention.
Figure 20:
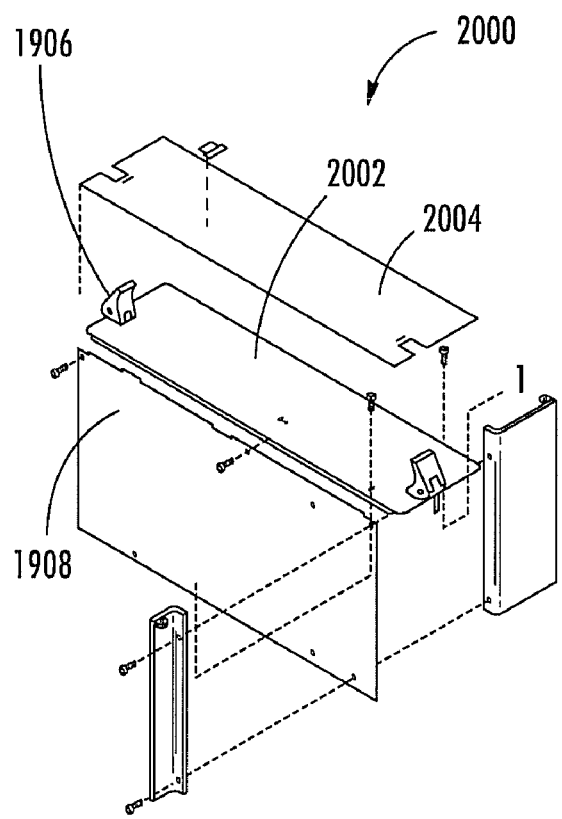

Referring to FIG. 20, a four-slot blank panel 2000 for directing air flow to components on printed wiring boards (PWBs) for a shelf is illustrated according to an exemplary embodiment of the present invention. The four-slot blank panel 2000 provides similar functionality as the blank panel 1900, except the four-slot blank panel 2000 is configured to fill a total of four slots in a telecom shelf. Advantageously, this enables fewer panels 2000 to fill multiple unoccupied slots.

FIG. 20 illustrates a front, side, and diagonal view of the four-slot blank panel 2000.

The blank panel 2000 includes a front faceplate 2002 optionally with a front face label 2004 for identifying the blank panel 2000. The front faceplate 2002 covers four slots on a shelf. The front faceplate 2002 includes latches 1906 for securing the blank panel 2000 in the shelf. The front faceplate 2002 is attached to a plate 1908. The plate 1908 is also supported by a vertical support 1910 which is attached to the front faceplate 2002 and the plate 1908. Those of ordinary skill in the art will recognize that the blank panels described herein can be configured to any size as required by the application, and the one-slot panel 1900 and four-slot panel 2000 are provided as an exemplary illustration.

By designing the enhanced blanks shelf cost can be reduced by allowing a partially loaded shelf with fewer fans per slot to operate with module components at the same temperature as smaller shelves. A major problem associated with expensive telecommunications modules that contain microwave circuits and lasers is that the state of the art circuits use considerable power to achieve higher data rates and require much greater cooling. The result is that higher power sources are required that operate at higher frequencies and create greater heat and emission levels produced. In addition the customer base has changed from just telecom central office applications to enterprise customers that have much narrower rack that will not fit wide shelves so the density on module must increase. This increase in density move EMI sources closer to the faceplate where reactive field density are greater resulting in higher emission levels from modules and closer proximity of sensitive circuits to immunity test sources such as those used during ESD compliance testing. In addition the fewer fans of much greater power are required to cool these circuits and as a result the system cooling and EMI shielding requirements are much greater. The EMI, thermal and acoustic compliance requirements for selling into European markets are demanding as well. The result is that more rack units are needed for these signal processing modules as well as fans that ultimately limits the system data processing rates and bandwidth.

Advantageously, the blank panels 1900, 2000 have been proven reliable during testing to specifications including NEBS GR63, GR78, GR 1089, ETSI 300-132-2 and IEC 300-386. The specifications include requirements for ESD immunity, radiated immunity and emissions, thermal shock, temperature cycle as well as humidity tests.

Although the present invention has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present invention and are intended to be covered by the following claims.

What is claimed is:

1. A power distribution unit, comprising:
    a printed circuit board;
    input power connections comprising a redundant feed from a power source;
    a common mode transformer vertically mounted on the printed circuit board, wherein the common mode transformer is configured to provide filtered power in multiple power feeds while limiting common mode emission levels;
    one or more inductors mounted on the printed circuit board, wherein the one or more inductors are configured to provide filtered power from the input power connections while limiting differential mode emission levels; and
    a plurality of fuses configured to received the filtered power from the common mode transformer and the one or more inductors.

2. The power distribution unit of claim 1, wherein the one or more inductors comprise high flux cores with at least 50% nickel content.

3. The power distribution unit of claim 1, wherein the one or more inductors are configured to provide filtered power of up to 80 A while limiting differential mode emission levels.

4. The power distribution unit of claim 1, wherein the one or more inductors are configured to provide filtered power in two feeds of up to 40 A each while limiting differential mode emission levels.

5. The power distribution unit of claim 1, wherein the common mode transformer comprises a very high permeability core of MN-ZN with an initial value of µ of 10000.

6. The power distribution unit of claim 1, wherein the printed circuit board comprises a six layer stack-up design.

7. The power distribution unit of claim 6, further comprising a chassis configured to house the printed circuit board, the common mode transformer, and the one or more inductors;
    wherein the chassis comprises perforations for convection.

8. The power distribution unit of claim 7, wherein the power distribution unit utilizes convection and conduction cooling to negate a need for fans.

9. The power distribution unit of claim 1, wherein the power distribution unit is configured to provide electromagnetic interference filtering at all frequencies in a range between 200 Hz and 200 MHz under all load conditions including feed failures.

10. The power distribution unit of claim 1, wherein the power distribution unit is compliant to one or more of NEBS GR63, GR78, GR 1089, IEC 60950, ETSI 300-132-2 and IEC 300-386.

11. A telecom power distribution unit, comprising:
    a printed circuit board;
    input power connections comprising a redundant feed from a power source;
    a common mode transformer vertically mounted on the printed circuit board for providing filtered power from the input power connections, wherein the common mode transformer comprises a very high permeability core of MN-ZN with an initial value of µ of 10000;
    one or more inductors mounted on the printed circuit board for providing filtered power from the input power connections, wherein the one or more inductors comprise high flux cores with at least 50% nickel content; and
    a plurality of fuses configured to received the filtered power from the common mode transformer and the one or more inductors.

12. The telecom power distribution unit of claim 11, wherein the one or more inductors are configured to provide filtered power of up to 80 A while limiting differential mode emission levels.

13. The telecom power distribution unit of claim 11, wherein the one or more inductors are configured to provide filtered power in two feeds of up to 40 A each while limiting differential mode emission levels.

14. The telecom power distribution unit of claim 11, wherein the common mode transformer is configured to provide filtered power in two feeds of up to 80 A while limiting common mode emission levels.

15. The telecom power distribution unit of claim 11, wherein the printed circuit board comprises a six layer stackup design.

16. The telecom power distribution unit of claim 15, further comprising a chassis configured to house the printed circuit board, the common mode transformer, and the one or more inductors;

wherein the chassis comprises perforations for convection.

17. The telecom power distribution unit of claim 16, wherein the telecom power distribution unit utilizes convection and conduction cooling to negate a need for fans.

18. The telecom power distribution unit of claim 11, wherein the telecom power distribution unit is configured to provide electromagnetic interference filtering at all frequencies in a range between 200 Hz and 200 MHz under all load conditions including feed failures; and wherein the telecom power distribution unit is compliant to one or more of NEBS GR63, GR78, GR 1089, IEC 60950, ETSI 300-132-2 and IEC 300-386.

* * * * *